(12) United States Patent
Fujikawa et al.

(10) Patent No.: US 7,776,664 B2
(45) Date of Patent: Aug. 17, 2010

(54) METHOD OF MANUFACTURING SEMICONDUCTOR DEVICE

(75) Inventors: Saishi Fujikawa, Kanagawa (JP); Kunio Hosoya, Kanagawa (JP); Yoko Chiba, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 109 days.

(21) Appl. No.: 12/255,382

(22) Filed: Oct. 21, 2008

(65) Prior Publication Data

US 2009/0117691 A1    May 7, 2009

(30) Foreign Application Priority Data

Oct. 23, 2007  (JP) ............... 2007-275804

(51) Int. Cl.
 H01L 21/00     (2006.01)
 H01L 21/84     (2006.01)
 H01L 21/331    (2006.01)
 H01L 21/8222   (2006.01)

(52) U.S. Cl. ............ 438/149; 438/311; 438/153; 438/158

(58) Field of Classification Search ........... 438/149, 438/152, 153, 30, 29, 48, 311, 154, 156, 438/157, 158, 155
See application file for complete search history.

(56) References Cited

U.S. PATENT DOCUMENTS

| | | | |
|---|---|---|---|
| 4,409,134 A | 10/1983 | Yamazaki | |
| RE34,658 E | 7/1994 | Yamazaki et al. | |
| 6,008,065 A | 12/1999 | Lee et al. | |
| 6,485,997 B2 * | 11/2002 | Lee et al. | 438/30 |
| 6,493,048 B1 | 12/2002 | Baek et al. | |
| 6,509,215 B2 * | 1/2003 | Fujikawa et al. | 438/151 |
| 6,630,687 B1 * | 10/2003 | Koyama et al. | 257/72 |
| 6,635,581 B2 | 10/2003 | Wong | |
| 7,023,021 B2 | 4/2006 | Yamazaki et al. | |
| 7,223,643 B2 | 5/2007 | Ohnuma et al. | |

(Continued)

FOREIGN PATENT DOCUMENTS

JP      03-011744      1/1991

(Continued)

OTHER PUBLICATIONS

C.W. Kim et al.; "42.1: A Novel Four-Mask-Count Process Architecture for TFT-LCDs"; *2000 International Symposium Digest of Technical Papers Digest*; pp. 1006-1009; May 2000.

*Primary Examiner*—Chuong A. Luu
(74) *Attorney, Agent, or Firm*—Fish & Richardson P.C.

(57) ABSTRACT

To achieve electro-optical devices typified by active matrix liquid crystal display devices with higher productivity and yield and lower manufacturing cost by reducing the number of steps of manufacturing a terminal portion and a pixel portion having an inverted staggered thin film transistor, specifically by reducing the number of photomasks used in a photolithography process. In view of this object, a photomask (multitone photomask) formed in such a manner that a light-transmitting substrate is provided with a transmitting portion, a partially-transmitting portion having a function of reducing light intensity, and a light-blocking portion is employed. Moreover, a lift-off method which does not require an etching step in patterning of a source electrode and a drain electrode of the pixel portion and a source wiring that extends to the terminal portion is employed.

18 Claims, 15 Drawing Sheets

U.S. PATENT DOCUMENTS

| | | |
|---|---|---|
| 7,315,344 B2 | 1/2008 | Lim |
| 2006/0275710 A1 | 12/2006 | Yamazaki et al. |
| 2006/0278875 A1 | 12/2006 | Ohnuma et al. |
| 2006/0290867 A1 | 12/2006 | Ahn et al. |
| 2007/0001225 A1 | 1/2007 | Ohnuma et al. |
| 2007/0002249 A1 | 1/2007 | Yoo et al. |
| 2007/0023790 A1 | 2/2007 | Ohnuma et al. |
| 2007/0037070 A1 | 2/2007 | Ohnuma et al. |
| 2007/0085475 A1 | 4/2007 | Kuwabara et al. |
| 2007/0126969 A1 | 6/2007 | Kimura et al. |
| 2007/0139571 A1 | 6/2007 | Kimura |
| 2007/0146591 A1 | 6/2007 | Kimura et al. |
| 2007/0146592 A1 | 6/2007 | Kimura |
| 2007/0148936 A1 | 6/2007 | Ohnuma |
| 2007/0222936 A1 | 9/2007 | Shih |

FOREIGN PATENT DOCUMENTS

| | | |
|---|---|---|
| JP | 09-171197 | 6/1997 |

\* cited by examiner

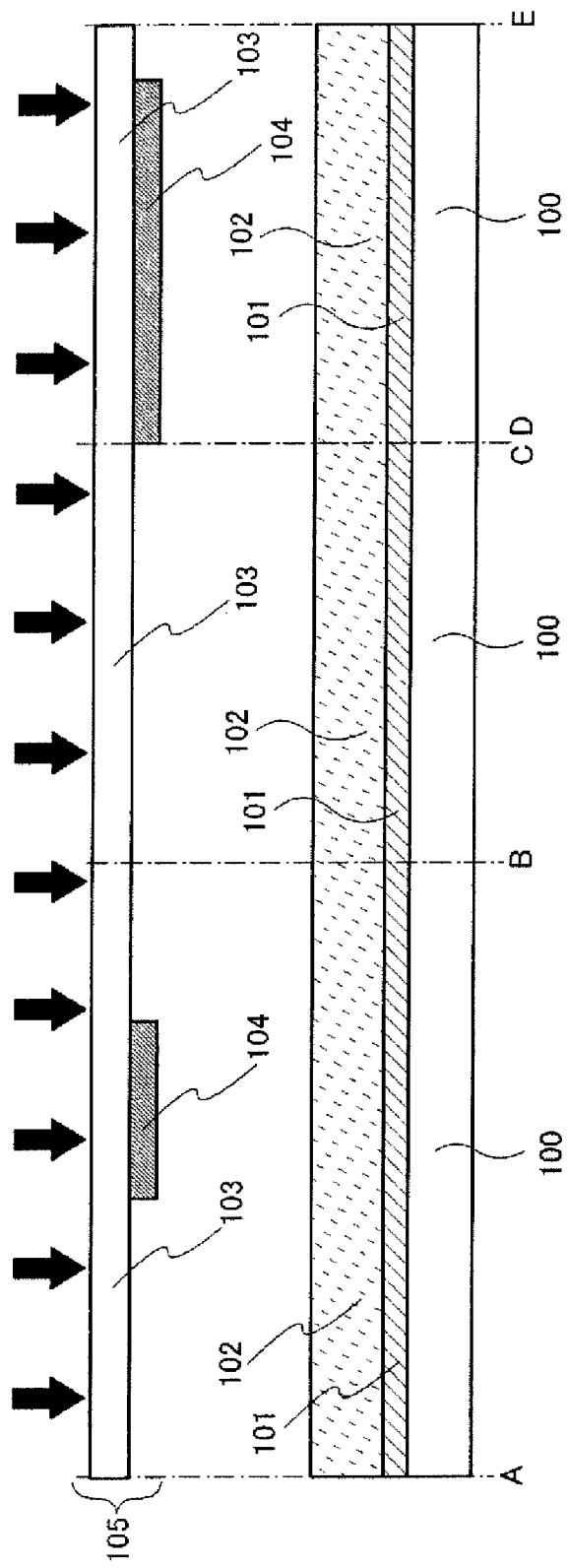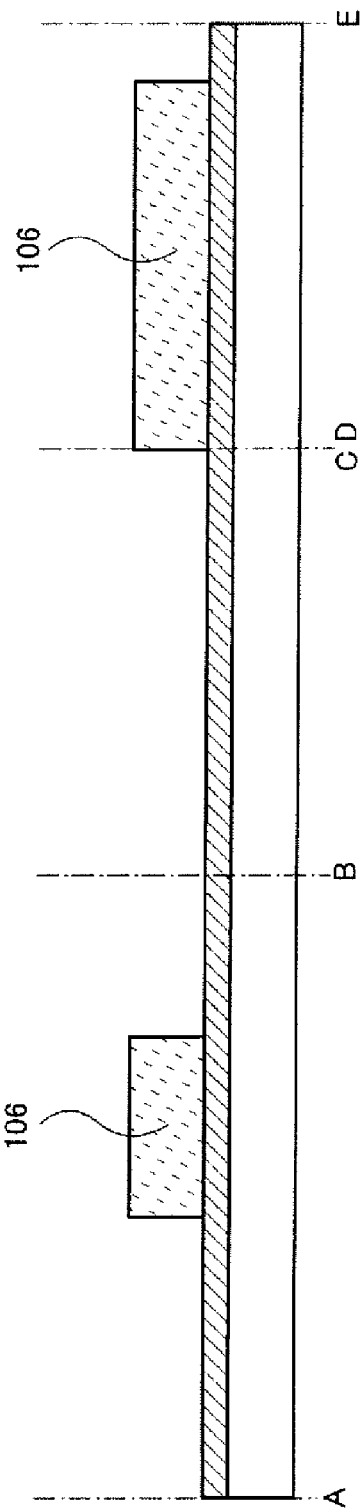

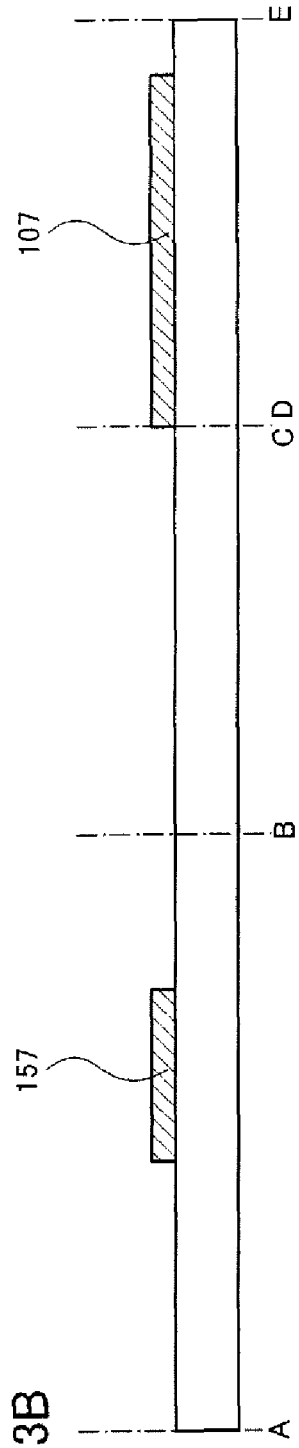
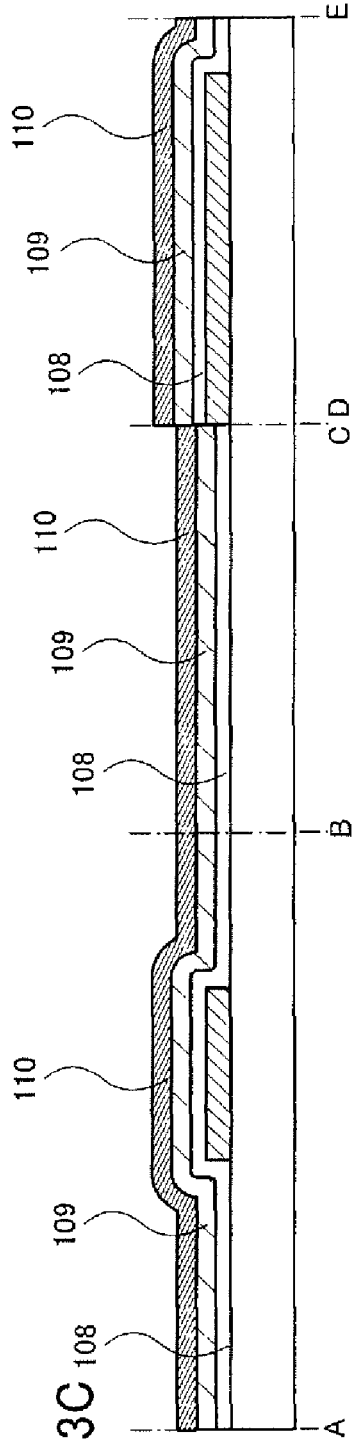
FIG. 3A
FIG. 3B
FIG. 3C

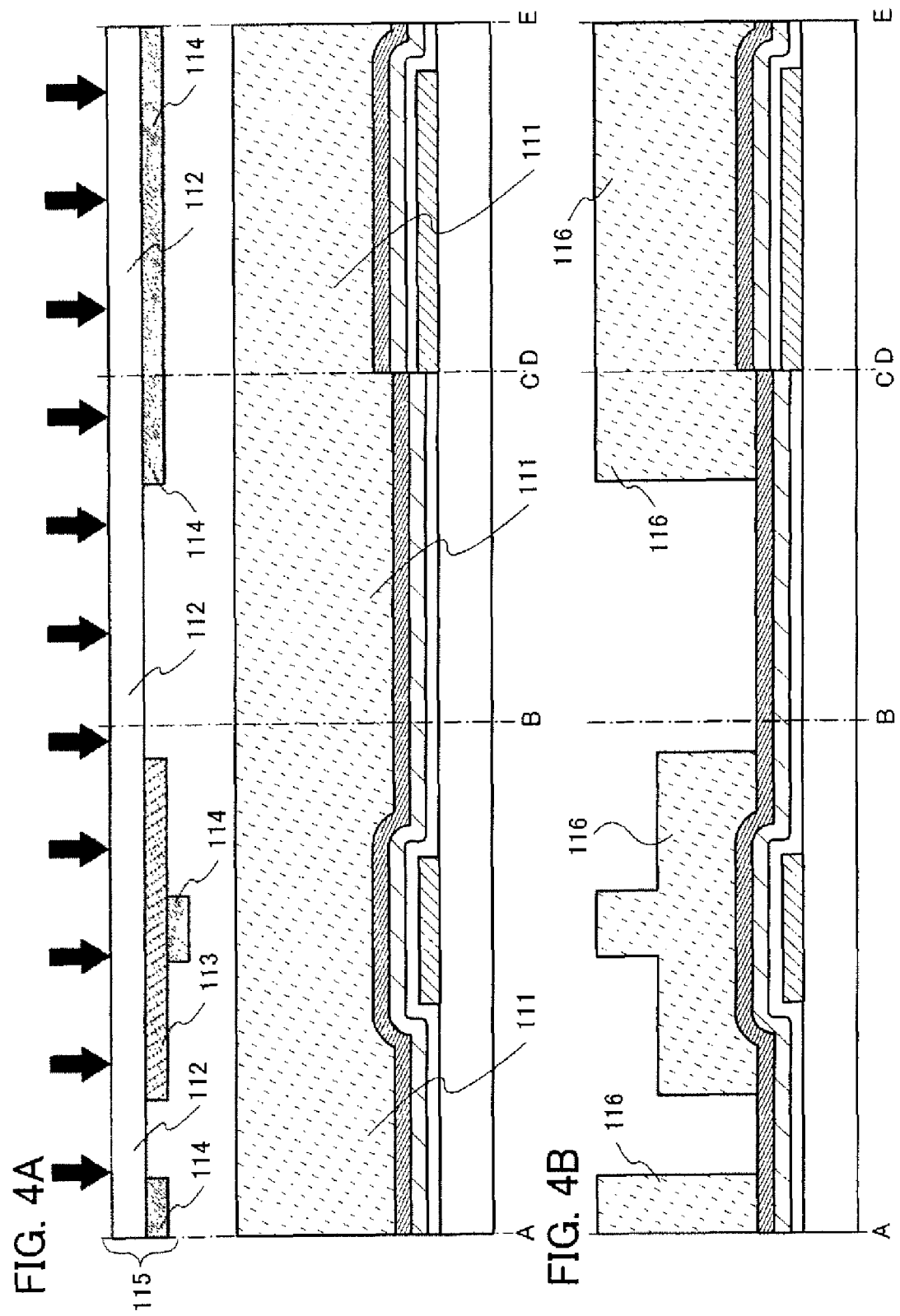

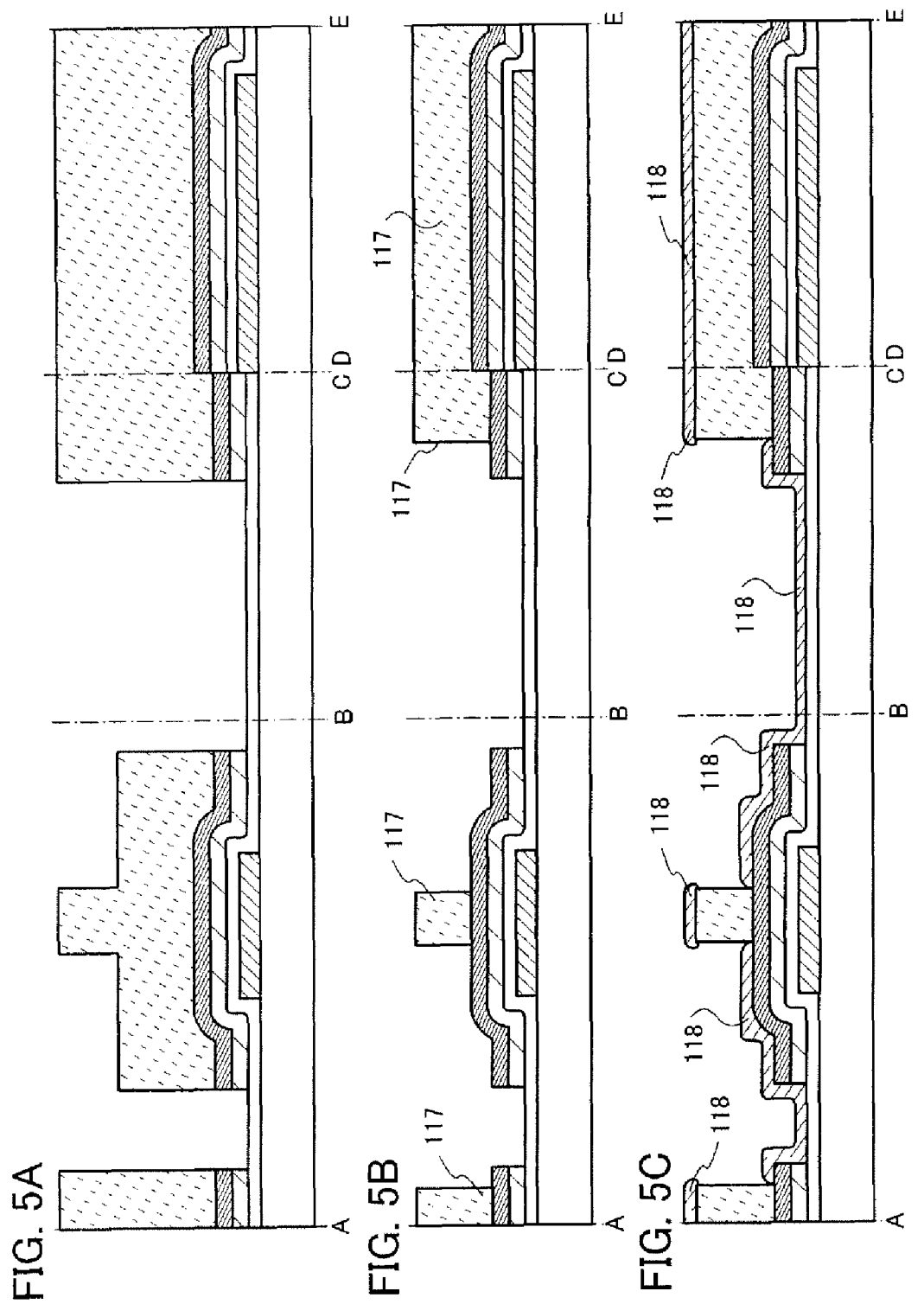

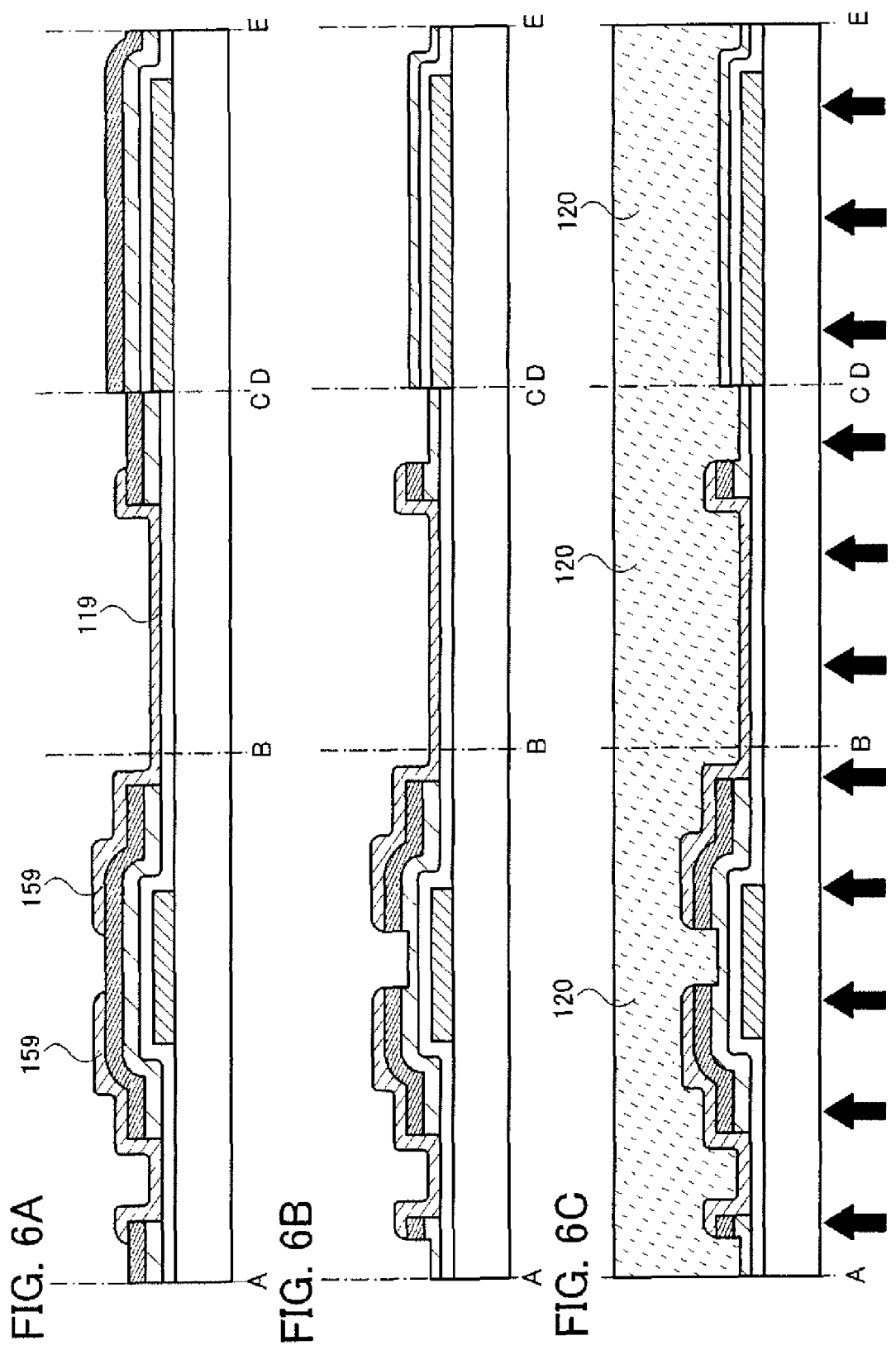

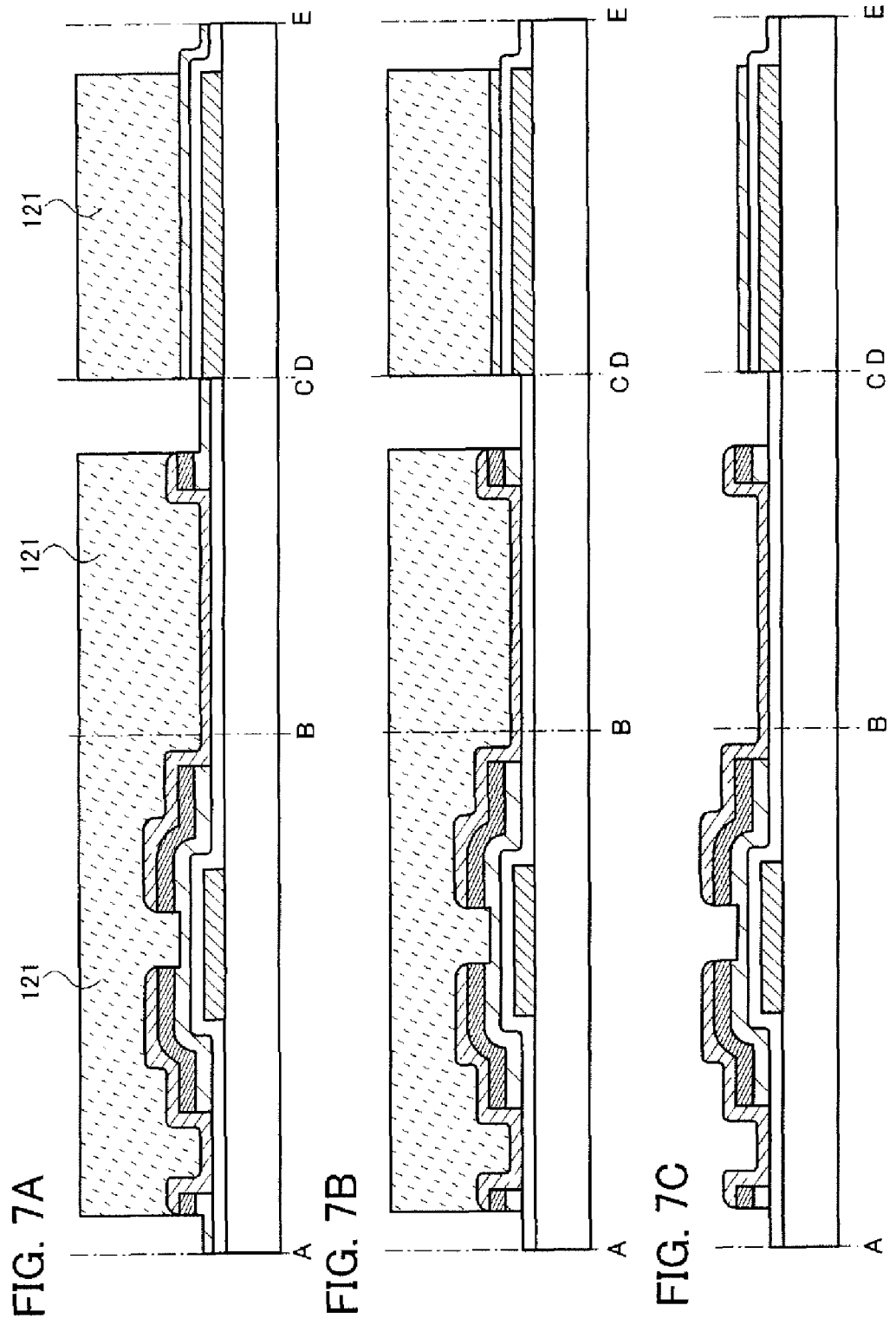

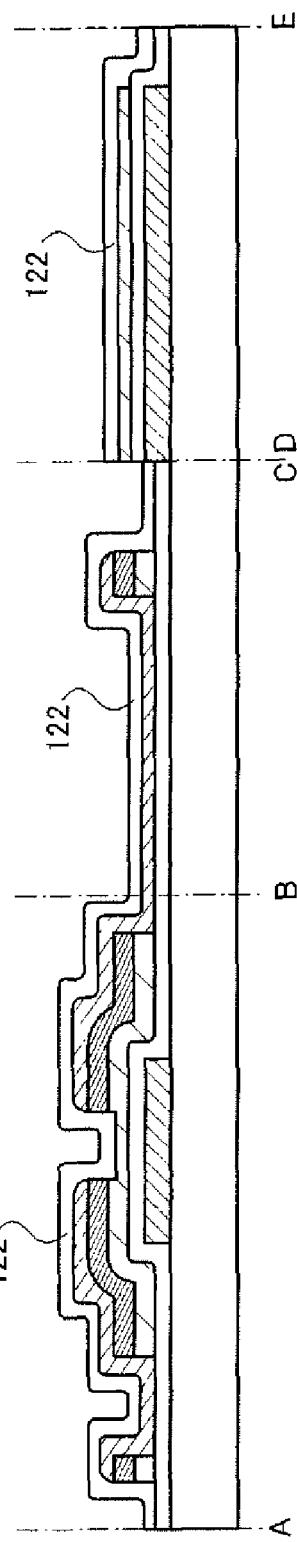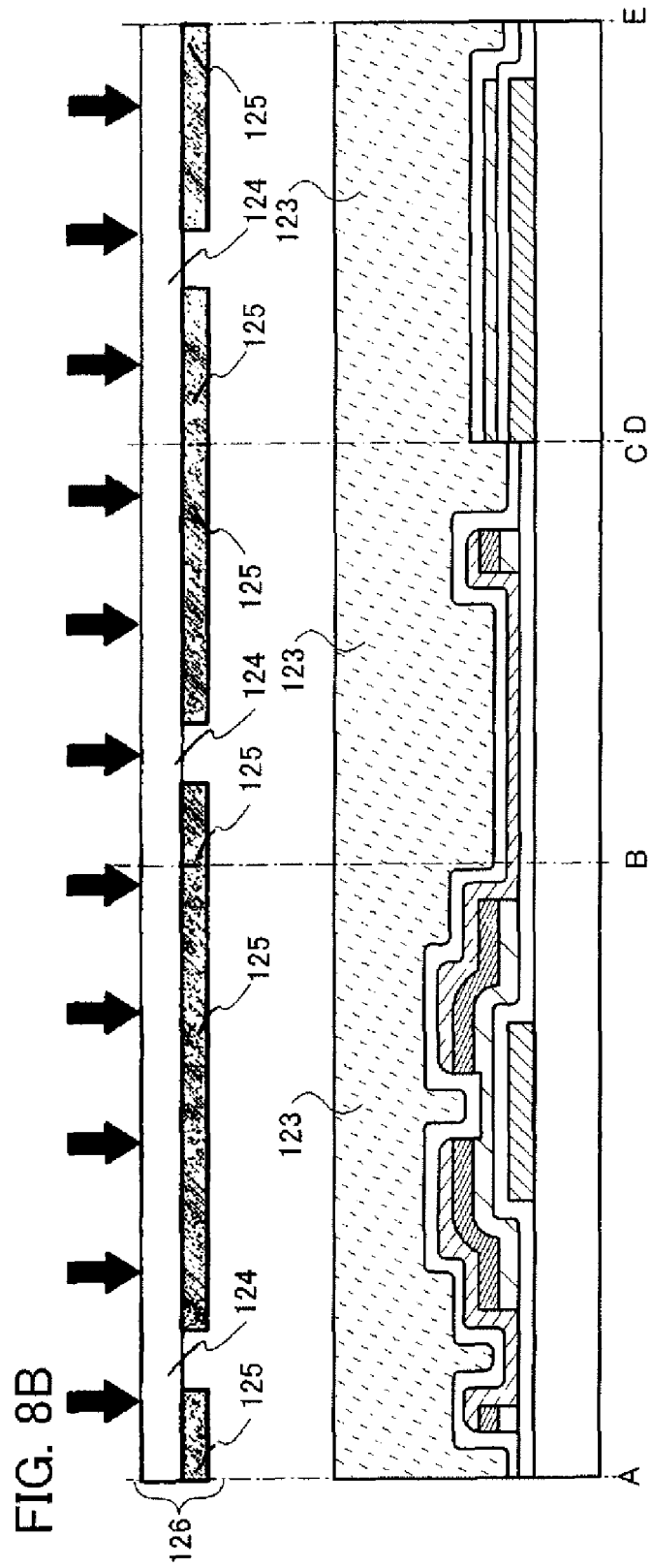

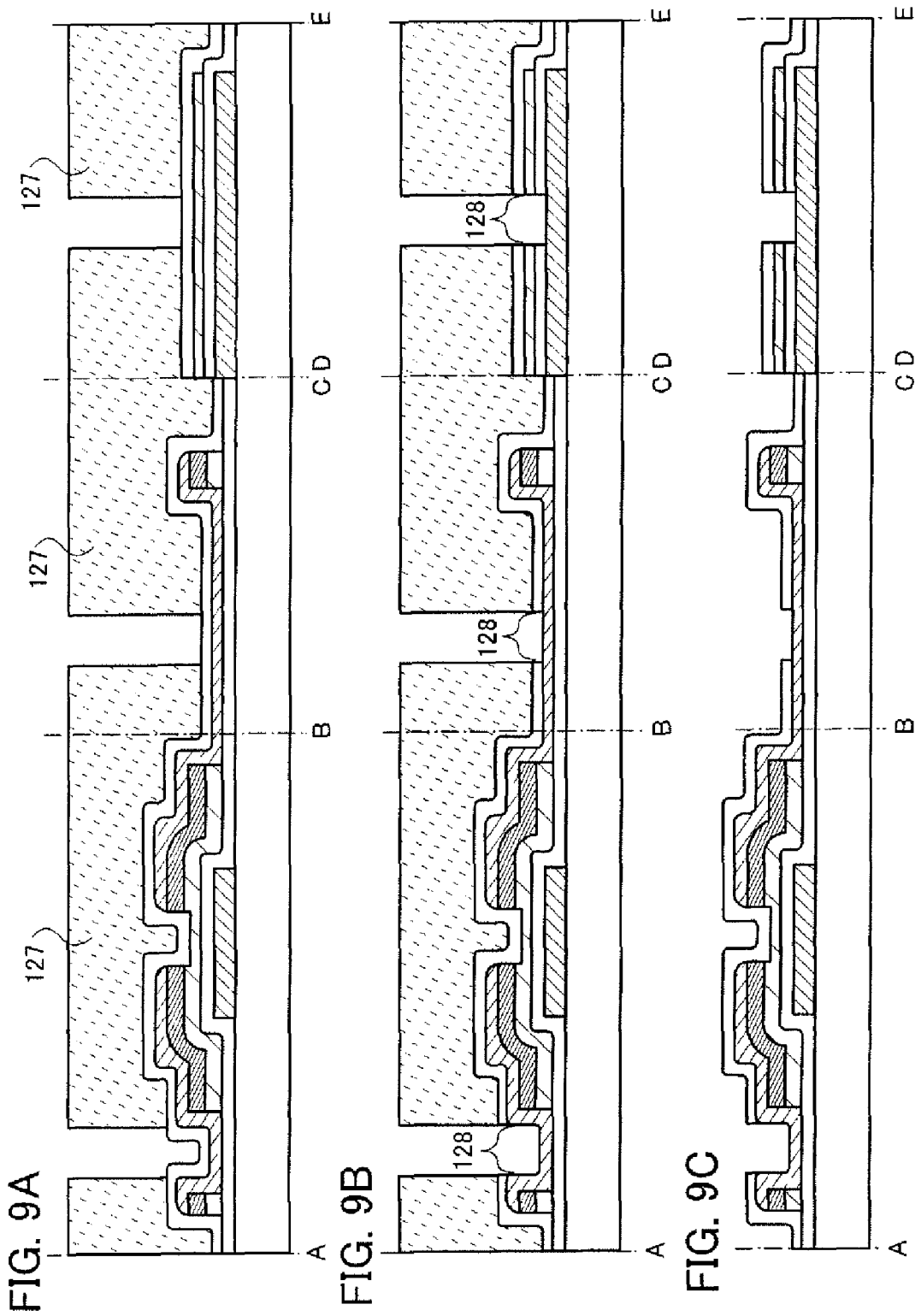

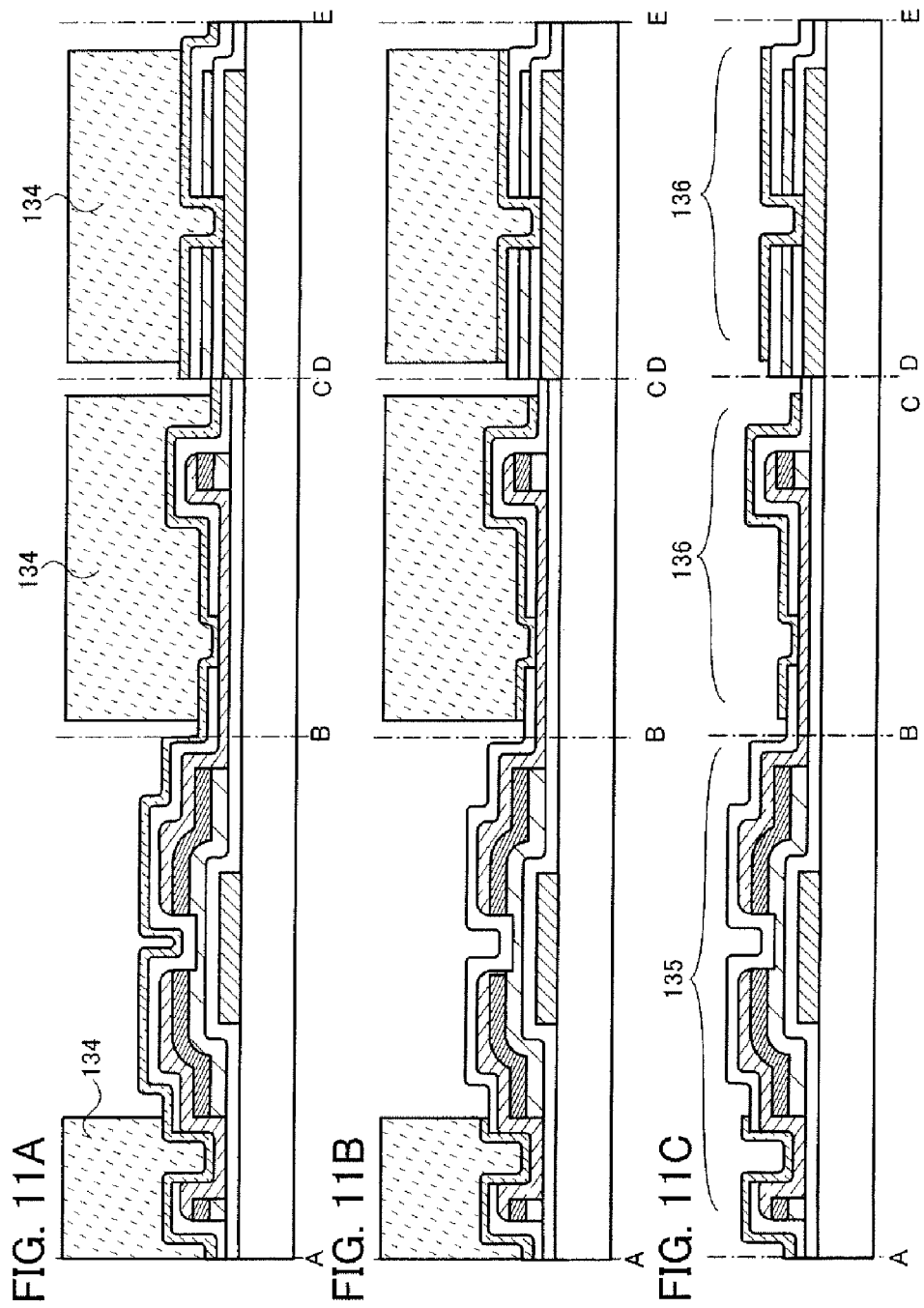

METHOD OF MANUFACTURING SEMICONDUCTOR DEVICE

BACKGROUND OF THE INVENTION

1. Field of the Invention

The present invention relates to a method of manufacturing a semiconductor device which has a circuit including a thin film transistor (hereinafter referred to as a TFT). For example, the present invention relates to a method of manufacturing an electro-optical device typified by a display device which uses a liquid crystal or a self-light-emitting element.

Note that a semiconductor device in this specification refers to all devices that can function by utilizing semiconductor characteristics, and electro-optical devices, semiconductor circuits, and electronic appliances are all semiconductor devices.

2. Description of the Related Art

In recent years, a technique for forming a TFT with use of a semiconductor thin film (with a thickness of about several nanometers to several hundreds of nanometers) formed over a substrate having an insulating surface has become popular. TFTs have been applied to electronic devices such as ICs and electro-optical devices, and widely used particularly as switching elements of electro-optical devices for displaying images.

As the electro-optical devices for displaying images, liquid crystal display devices widely used for displays of thin television sets, personal computers, cellular phones, and the like are known. Many liquid crystal display devices are of active matrix type because high-definition images can be obtained as compared with those of passive matrix type. An active matrix liquid crystal display device includes a pixel portion serving as a display region, a terminal portion manufactured at an end of a substrate for electric connection with a wiring of a circuit provided over another substrate, and the like. In this liquid crystal display device, gate wirings and source wirings extend in matrix and pixel electrodes disposed in the matrix are controlled by TFTs, whereby images are displayed. Specifically, by voltage applied between a selected pixel electrode and a counter electrode corresponding to the pixel electrode, a liquid crystal layer disposed between the pixel electrode and the counter electrode is optically modulated. Observers recognize this optical modulation as a display pattern.

The application range of the electro-optical devices typified by such active matrix liquid crystal display devices is expanding, and demands for higher definition, a higher aperture ratio, and higher reliability are increasing as a screen size gets larger. At the same time, there are increasing demands for higher productivity and cost reduction.

Conventionally, an amorphous silicon film has been preferably used as an amorphous semiconductor film because an amorphous silicon film can be formed over a large-area substrate at low temperatures of 300° C. or lower. Moreover, many inverted staggered (or bottom gate) TFTs whose channel formation regions are formed of amorphous semiconductor films have been used; therefore, a standard manufacturing method thereof has been established. For example, Japanese Published Patent Application No. H9-171197 has disclosed a method of forming a TFT portion and a terminal portion (pad portion) over a substrate with use of five photomasks (five photographic stages).

SUMMARY OF THE INVENTION

Conventionally, the manufacturing cost of electro-optical devices typified by active matrix liquid crystal display devices has been high because a pixel portion having a TFT and a terminal portion are manufactured over a substrate with use of at least 5 photomasks in accordance with a photolithography technique. In order to improve the productivity to increase the yield, reduction in the number of steps is considered as an effective means.

In specific, it is necessary to reduce the number of photomasks required in manufacturing a pixel portion including a TFT and a terminal portion. A photomask is used for forming a photoresist pattern which functions as a mask at the time of processing a thin film formed over a substrate into a desired shape by etching or the like in a photolithography technique. Note that processing a thin film formed over a substrate into a desired shape is called patterning.

By the use of one photomask, the following steps are performed, which are very troublesome: resist formation, prebaking, light-exposure using the photomask, development, postbaking, and the like and moreover other steps before and after the aforementioned steps, such as film formation, etching, and the like and further resist separation, cleaning, drying, inspection, and the like. Conventionally, five or more photomasks are used; therefore, the aforementioned steps are repeated five or more times. Thus, the productivity and yield of the pixel portion including a TFT and the terminal portion are largely affected. In order to improve the productivity and yield of the pixel portion including a TFT and the terminal portion, reduction in the number of photomasks is a significant object.

The present invention has been made in view of such problems, and it is an object of the present invention to improve the productivity and yield of a pixel portion including a TFT and a terminal portion of an electro-optical device typified by an active matrix liquid crystal display device and to reduce the manufacturing cost thereof, by reducing the number of steps for manufacturing the pixel portion including a TFT and the terminal portion, specifically by reducing the number of photomasks used in a photolithography process.

In an aspect of the present invention made in order to solve the problems, an inverted staggered TFT structure is employed, a first photoresist pattern is formed using a photomask (a multitone photomask) which is formed in such a manner that a light-transmitting substrate is provided with a transmitting portion, a partially-transmitting portion having a function of reducing light intensity, and a light-blocking portion; a first semiconductor film and a second semiconductor film which includes an impurity element imparting one conductivity type are etched using the first photoresist pattern as a mask; a second photoresist pattern is formed by processing the first photoresist pattern; a conductive film is formed over an entire surface; and the second photoresist pattern and the conductive film formed over the second photoresist pattern are removed at the same time so that a source electrode and a drain electrode in a pixel portion and a source wiring that extends to a terminal portion are formed.

Moreover, in the present invention, the source electrode and the drain electrode in the pixel portion and the source wiring that extends to the terminal portion are formed of the same material in the same step.

Further, in the present invention, each of the first semiconductor film and the second semiconductor film can be formed using an amorphous semiconductor film; alternatively, the first semiconductor film can be formed using a stack of a microcrystalline semiconductor film and an amorphous semiconductor film.

In another aspect of the present invention, a first conductive film is formed over an entire surface of a light-transmitting substrate; a first photoresist pattern is formed using a first photomask which is formed in such a manner that a light-transmitting substrate is provided with a transmitting portion and a light-blocking portion; the first conductive film is etched using the first photoresist pattern as a mask; a gate electrode in a pixel portion and a gate wiring that extends to a terminal portion are formed; an insulating film functioning as a gate insulating film, a first semiconductor film and a second semiconductor film including an impurity element imparting one conductivity type are formed sequentially; a second photoresist pattern is formed using a second photomask (a multitone photomask) which is formed in such a manner that a light-transmitting substrate is provided with a transmitting portion, a partially-transmitting portion having a function of reducing light intensity, and a light-blocking portion; the first semiconductor film and the second semiconductor film including the impurity element imparting one conductivity type are etched using the second photoresist pattern as a mask; the second photoresist pattern is processed to form a third photoresist pattern; a second conductive film is formed over an entire surface of the substrate; the third photoresist pattern and the second conductive film formed over the third photoresist pattern are removed at the same time so that a source electrode and a drain electrode in the pixel portion and a source wiring that extends to the terminal portion are formed; the first semiconductor film and the second semiconductor film including the impurity element imparting one conductivity type are etched using as a mask, the source electrode and the drain electrode in the pixel portion and the source wiring that extends to the terminal portion, which are formed of the second conductive film; a fourth photoresist pattern is formed using as a light-blocking portion (rear-surface light exposure), the gate electrode in the pixel portion and the gate wiring that extends to the terminal portion, which are formed of the first conductive film, and the source electrode and the drain electrode in the pixel portion and the source wiring that extends to the terminal portion, which are formed of the second conductive film; the first semiconductor film is etched using the fourth photoresist pattern as a mask; an insulating film functioning as a passivation film is formed; a fifth photoresist pattern is formed using a third photomask which is formed in such a manner that a light-transmitting substrate is provided with a transmitting portion and a light-blocking portion; an opening for electric contact is formed using the fifth photoresist pattern; a transparent conductive film is formed over an entire surface; a sixth photoresist pattern is formed using a fourth photomask which is formed in such a manner that a light-transmitting substrate is provided with a transmitting portion and a light-blocking portion; and the transparent conductive film is etched using the sixth photoresist pattern as a mask, so that a pixel electrode in the pixel portion and an electrode in the terminal portion are formed.

Moreover, in the present invention, the gate electrode in the pixel portion and the gate wiring that extends to the terminal portion are formed of the same material in the same step and the source electrode and the drain electrode in the pixel portion and the source wiring that extends to the terminal portion are formed of the same material in the same step.

Further, in the present invention, each of the first semiconductor film and the second semiconductor film can be formed using an amorphous semiconductor film; alternatively, the first semiconductor film can be formed using a stack of a microcrystalline semiconductor film and an amorphous semiconductor film.

In an electro-optical device typified by an active matrix liquid crystal display device made in accordance with the present invention, a pixel portion including an inverted staggered TFT and a terminal portion can be manufactured with four photomasks, which means the number of photomasks conventionally required (at least five) can be reduced by one. By the reduction of one photomask, the productivity, and yield of electro-optical devices can be improved and the manufacturing cost thereof can be reduced.

More specifically, the present invention makes it possible to eliminate a photomask used for patterning of a source electrode and a drain electrode in a pixel portion including an inverted staggered TFT and a source wiring that extends to a terminal portion and moreover to eliminate an etching step for patterning of the source electrode and the drain electrode in the pixel portion and the source wiring that extends to the terminal portion. Therefore, the productivity and yield of electro-optical devices can be improved and the manufacturing cost thereof can be reduced.

BRIEF DESCRIPTION OF THE DRAWINGS

FIGS. 2A and 2B are cross-sectional views showing a process of manufacturing the semiconductor device in accordance with the present invention.

FIGS. 3A to 3C are cross-sectional views showing the process of manufacturing the semiconductor device in accordance with the present invention.

FIGS. 4A and 4B are cross-sectional views showing the process of manufacturing the semiconductor device in accordance with the present invention.

FIGS. 5A to 5C are cross-sectional views showing the process of manufacturing the semiconductor device in accordance with the present invention.

FIGS. 6A to 6C are cross-sectional views showing the process of manufacturing the semiconductor device in accordance with the present invention.

FIGS. 7A to 7C are cross-sectional views showing the process of manufacturing the semiconductor device in accordance with the present invention.

FIGS. 8A and 8B are cross-sectional views showing the process of manufacturing the semiconductor device in accordance with the present invention.

FIGS. 9A to 9C are cross-sectional views showing the process of manufacturing the semiconductor device in accordance with the present invention.

FIGS. 11A to 11C are cross-sectional views showing the process of manufacturing the semiconductor device in accordance with the present invention.

DETAILED DESCRIPTION OF THE INVENTION

Embodiment Modes of the present invention will hereinafter be described with reference to the drawings.

Embodiment Mode 1

Figure 1:
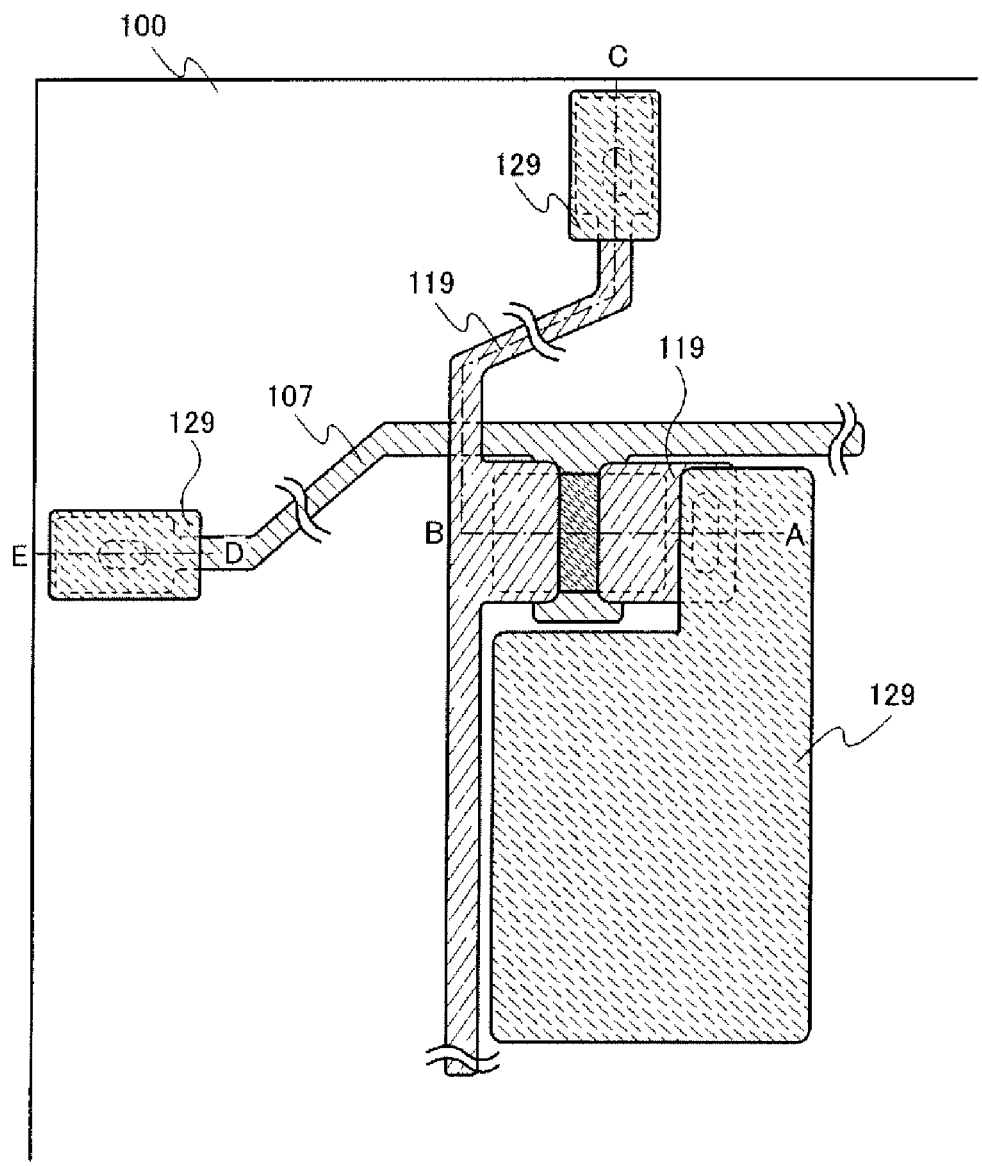
FIG. 1 is a top view of a semiconductor device manufactured in accordance with the present invention.

Embodiment Mode 1 of the present invention is described with reference to FIG. 1, FIGS. 2A and 2B, FIGS. 3A to 3C, FIGS. 4A and 4B, FIGS. 5A to 5C, FIGS. 6A to 6C, FIGS. 7A to 7C, FIGS. 8A and 8B, FIGS. 9A to 9C, FIGS. 10A and 10B, FIGS. 11A to 11C, and FIG. 12. Embodiment Mode 1 describes in details, steps in a method of manufacturing an inverted staggered TFT whose channel formation region is formed using an amorphous semiconductor film. At the same time, Embodiment Mode 1 shows a process of manufacturing a terminal portion at an end of a substrate 100, which is electrically connected to a wiring of a circuit provided over another substrate. FIG. 1 is a top view of a semiconductor device manufactured in accordance with Embodiment Mode 1. FIGS. 2A and 2B, FIGS. 3A to 3C, FIGS. 4A and 4B, FIGS. 5A to 5C, FIGS. 6A to 6C, FIGS. 7A to 7C, FIGS. 8A and 8B, FIGS. 9A to 9C, FIGS. 10A and 10B, FIGS. 11A to 11C, and FIG. 12 show cross sections along A-B, B-C, and D-E of FIG. 1. The cross section along A-B corresponds to a pixel portion, whereas the cross-sections along B-C and D-E correspond to terminal portions. Although FIG. 1 shows a structure in which one source wiring and one gate wiring extend from terminal portions, an actual display device using liquid crystal or a self-light-emitting element has a plurality of pixels arranged in matrix and a plurality of source wirings and gate wirings arranged corresponding to the pixels.

Note that the present invention can be carried out in many different modes and it is easily understood by those skilled in the art that the mode and detail of the present invention can be variously changed without departing from the scope and spirit of the present invention. Therefore, the present invention is not construed as being limited to the description of Embodiment Modes.

First, the substrate 100 which has a light-transmitting property is prepared in FIG. 2A. As the substrate 100, a glass substrate of aluminoborosilicate glass or barium borosilicate glass typified by #7059 glass or #1737 glass manufactured by Corning Incorporated can be used. Alternatively, a light-transmitting substrate such as a quartz substrate or a plastic substrate can be used. In the case of using a mother glass as the substrate 100, any substrate of the following generation may be used: the first generation (320 mm×400 mm), the second generation (400 mm×500 mm), the third generation (550 mm×650 mm), the fourth generation (680 mm×880 mm or 730 mm×920 mm), the fifth generation (1000 mm×120 mm or 1100 mm×1250 mm), the sixth generation (1500 mm×1800 mm), the seventh generation (1900 mm×2200 mm), the eighth generation (2160 mm×2460 mm), the ninth generation (2400 mm×2800 mm or 2450 mm×3050 mm), the tenth generation (2950 mm×3400 mm), and the like.

Subsequently, a conductive film 101 for forming a gate electrode in a pixel portion and a gate wiring that extends to a terminal portion is formed over an entire surface of the substrate 100, and then a resist 102 is formed.

Next, a photolithography process is performed using a first photomask 105 which is formed in such a manner that a light-transmitting substrate 103 is provided with a transmitting portion and a light-blocking portion 104 formed of a metal film including chromium (Cr) or the like. Arrows in FIG. 2A indicate exposure light which transmits through the first photomask 105 to reach the resist 102. A photoresist pattern 106 is formed (see FIG. 2B) after the light exposure and development steps. Then, patterning is performed to remove an unnecessary part of the conductive film 101 by etching (see FIG. 3A) and the photoresist pattern 106 is separated, so that a gate electrode 157 in the pixel portion and a gate wiring 107 that extends to the terminal portion are formed (see FIG. 3B). The gate electrode in the pixel portion and the gate wiring that extends to the terminal portion are formed of the same material.

The gate electrode 157 in the pixel portion and the gate wiring 107 that extends to the terminal portion are desirably formed of a low-resistant conductive material such as aluminum (Al) or copper (Cu); however, when such a material is used alone, it is inferior in heat resistance and tends to cause problems of hillock, corrode, be separated (adhesiveness to the substrate), and the like. Therefore, such a material is used in combination with a heat-resistant conductive material. Alternatively, AgPdCu alloy may be used as the low-resistant conductive material. As the heat-resistant conductive material, an element selected from titanium (Ti), tantalum (Ta), tungsten (W), molybdenum (Mo), chromium (Cr), or neodymium (Nd); an alloy containing any of these elements; an alloy film including a combination of these elements; or a nitride containing any of these elements is used. For example, a stack of titanium (Ti) and copper (Cu) or a stack of tantalum nitride and copper (Cu) can be given. The combination with the heat-resistant conductive material such as titanium (Ti), silicon (Si), chromium (Cr), or neodymium (Nd) is preferable because the flatness is improved. Further alternatively, combination of only these heat-resistant conductive materials, for example, molybdenum (Mn) and tungsten (W) may be used.

In order to achieve a liquid crystal display device, the gate electrode 157 in the pixel portion and the gate wiring 107 that extends to the terminal portion are desirably formed of a combination of a heat-resistant conductive material and a low-resistant conductive material. Description will hereinafter be made concerning appropriate combinations.

In the case of a screen size of up to about 5 inches, a two-layer structure is employed in which a conductive film (A) including a nitride of a heat-resistant conductive material and a conductive film (B) including a heat-resistant conductive material are stacked. The conductive film (B) may be formed of an element selected from tantalum (Ta), titanium (Ti), tungsten (W), neodymium (Nd), or chromium (Cr); an alloy including any of these elements; or an alloy film including a combination of these elements. The conductive film (A) may be formed using a tantalum nitride film, a tungsten nitride film, a titanium nitride film, or the like. The conductive film (A) is formed to a thickness of 10 nm to 100 nm (preferably 20 nm to 50 nm), while the conductive film (B) is formed to a thickness of 200 nm to 400 nm (preferably 250 nm to 350 nm).

On the other hand, in the case of a large screen, a three-layer structure is preferable in which a conductive film (A) including a heat-resistant conductive material, a conductive film (B) including a low-resistant conductive material, and a conductive film (C) including a heat-resistant conductive material are stacked. The conductive film (B) including a low-resistant conductive material is formed of a material including aluminum (Al). As well as pure aluminum (Al), aluminum (Al) including 0.01 to 5 atomic % of scandium (Sc), titanium (Ti), neodymium (Nd), silicon (Si), or the like is used. The conductive film (C) has an effect of preventing aluminum (Al) of the conductive film (B) from having hillocks. The conductive film (A) is formed to a thickness of 10 nm to 100 nm (preferably 20 nm to 50 nm), the conductive film (B) is formed to a thickness of 200 μm to 400 nm (preferably 250 nm to 350 nm), and the conductive film (C) is formed to a thickness of 10 nm to 100 nm (preferably 20 nm to 50 nm). In this embodiment mode, the conductive film (A) is formed to a thickness of 50 nm using a titanium (Ti) film by a sputtering method with titanium (Ti) used as a target, the conductive film (B) is formed to a thickness of 200 nm using an aluminum film by a sputtering method with aluminum (Al) used as a target, and the conductive film (C) is formed to a thickness of 50 nm using a titanium (Ti) film by a sputtering method with titanium (Ti) used as a target.

Note that a positive resist is used in this embodiment mode. A positive resist refers to a type of resist whose light-exposed region is soluble in a developer Needless to say, a negative resist may be used if possible. A negative resist refers to a type of resist whose light-exposed region is not soluble in a developer.

Next, an insulating film 108 is formed over an entire surface (see FIG. 3C). The insulating film 108 is formed to a thickness of 50 nm to 200 nm by a plasma CVD method, a sputtering method, or the like. This insulating film 108 functions as a gate insulating film.

For example, a silicon nitride film is formed as the insulating film 108 to a thickness of 150 nm. Needless to say, the insulating film 108 is not limited to a silicon nitride film. The insulating film 108 may be formed to have a single-layer structure or a stacked structure using another insulating film such as a silicon oxide film, a silicon oxynitride film, a silicon nitride oxide film, or a tantalum oxide film. For example, a stacked structure including a silicon nitride film or a stacked structure including a silicon nitride film as a lower layer and a silicon oxide film as an upper layer may be employed. Here, a silicon oxynitride film means a film that contains more oxygen than nitrogen and contains oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively. Further, a silicon nitride oxide film means a film that contains more nitrogen than oxygen and contains oxygen, silicon, and hydrogen at concentrations ranging from 15 at. % to 30 at. %, 20 at. % to 35 at. %, 25 at. % to 35 at. %, and 15 at. % to 25 at. %, respectively. Furthermore, it is preferable to form the insulating film 108 by use of a microwave plasma CVD apparatus with a frequency of 1 GHz. A silicon oxynitride film, a silicon nitride oxide film, or the like which is formed by a microwave plasma CVD apparatus has high withstand voltage, and thus, the reliability of a TFT to be formed later can be increased.

Next, a first amorphous semiconductor film 109 is formed to a thickness of 50 nm to 200 nm (preferably 100 nm to 150 nm) over the insulating film 108 by a plasma CVD method, a sputtering method, or the like (see FIG. 3C).

An amorphous silicon (a-Si) film is typically used as this first amorphous semiconductor film. Alternatively, a compound semiconductor film having an amorphous structure, such as an amorphous silicon germanium film or an amorphous silicon carbide film can be used.

Then, a second amorphous semiconductor film 110 including an impurity element imparting one conductivity type is formed over the entire surface to a thickness of 20 nm to 80 nm by a plasma CVD method, a sputtering method, or the like (see FIG. 3C).

In a case of forming an n-channel TFT, the second amorphous semiconductor film 110 may include phosphorus (P) as a typical impurity element.

Next, the entire surface is coated with a resist 111 as shown in FIG. 4A.

After that, a photolithography process is performed using a second photomask 115 which is formed in such a manner that a light-transmitting substrate 112 is provided with a transmitting portion, a partially-transmitting portion 113 having a function of reducing light intensity, and a light-blocking portion 114 formed of a metal film including Cr or the like. Arrows shown in FIG. 4A indicate exposure light which transmits through the second photomask 115 to reach the resist 111. Through light-exposure and development steps, photoresist patterns 116 is formed (see FIG. 4B).

The second photomask 115 is called a multitone photomask, which has a feature of having a partially-transmitting portion in addition to a transmitting portion and a light-blocking portion. In contrast, a general photomask has only a transmitting portion and a light-blocking portion. That is to say, a multitone photomask refers to a photomask with a structure in which a partially-transmitting portion with a transmittance of 1% to 99% and a light-blocking portion with a transmittance of about 0% are provided over a light-transmitting substrate that transmits about 100% of exposure light. Depending on a method of forming this partially-transmitting portion, multitone photomasks are classified into halftone photomasks and graytone photomasks.

A halftone photomask is obtained by having a partially-transmitting film at a partial transmitting portion. On the other hand, a graytone photomask has a slit less than the resolution at a transmitting portion. With the slit blocking part of exposure light, a partial transmitting portion is formed. A resist exposed to light with such a multitone photomask includes a light-exposed portion, a partially-light-exposed portion, and a non-light-exposed portion. When the resist in the partially-light-exposed portion is developed, the thickness of the resist is between the thicknesses of the resists in the light-exposed portion and the non-light-exposed portion (see FIG. 4B).

Next, patterning is performed by removing unnecessary portions of the first amorphous semiconductor film 109 and the second amorphous semiconductor film 110 by etching with the use of the photoresist patterns 116 (see FIG. 5A).

Next, oxygen plasma ashing or the like is performed to decrease the film thickness and width of the photoresist pattern 116, thereby forming a photoresist pattern 117 (see FIG. 5B).

After that, a conductive film 118 including a metal material is formed over the entire surface by a sputtering method, a vacuum evaporation method, or the like. The material of the conductive film 118 is not particularly limited as long as it is a metal material that can have ohmic contact with the second amorphous semiconductor film 110; for example, an element selected from aluminum (Al), chromium (Cr), tantalum (Ta), or titanium (Ti), an alloy including any of these elements, an alloy film including a combination of these elements, or the like is given. In this embodiment mode, a sputtering method is employed to form as the conductive film 118, a titanium (Ti) film to a thickness of 50 nm to 150 nm, an aluminum (Al) film to a thickness of 300 nm to 400 nm on the titanium (Ti) film, and another titanium (Ti) film to a thickness of 100 nm to 150 nm on the aluminum film (see FIG. 5C).

At this time, some parts of the conductive film 118 over the photoresist pattern 117 and other parts of the conductive film 118 over regions except the photoresist pattern 117 are different in height due to the photoresist pattern 117, as shown in FIG. 5C. Because of this difference in height, the conductive film 118 is disconnected. Therefore, the disconnected parts of the conductive film 118 over the photoresist pattern 117 can be simultaneously removed together with the photoresist pattern 117 when the photoresist pattern 117 is removed by separation (lift-off method). As a result, the patterning of the conductive film 118 can be performed without a new photomask and an etching step for patterning. Thus, source and drain electrodes 159 in a pixel portion and a source wiring 119 that extends to a terminal portion can be formed (see FIG. 6A). The source electrode and the drain electrode in the pixel portion are formed of the same material as the source wiring that extends to the terminal portion.

In order to surely disconnect some parts of the conductive film 118 over the photoresist pattern 117 and other parts thereof over regions except the photoresist pattern 117 due to the difference in height, it is necessary to carefully consider the relation of the film thickness and shape between the photoresist pattern 117 and the conductive film 118. In order to increase the difference in height, the photoresist pattern 117 is preferably formed to be thicker (several micrometers to several tens of micrometers); alternatively, the photoresist pattern 117 may have an inversely-tapered shape in order to decrease the coverage with the conductive film 118. The shape of the photoresist pattern 117 is obtained by performing light-exposure with the use of the second photomask 115, development, and then oxygen plasma ashing on the resist 111; therefore, the resist 111 needs to have enough thickness.

In contrast, the conductive film 118 is preferably thin in order to decrease the coverage with the conductive film 118. Moreover, it is preferable to form the conductive film 118 with a stacked structure as shown in this embodiment mode rather than forming the conductive film 118 with a single-layer structure, even if the total film thickness is the same. The coverage with the conductive film 118 is low as compared with that in the case of forming the conductive film 118 with a single-layer structure, because the conductive film 118 is formed by stacking thin films whose coverage is low. When a second layer of the conductive film 118 (hereinafter called the second layer) is formed, a first layer of the conductive film 118 which has been disconnected (hereinafter called the first layer) exists over the photoresist pattern 117. Therefore, the difference in height between some parts of the first layer disconnected over the photoresist pattern 117 and other parts thereof over regions except the photoresist pattern 117 is equal to that due to the photoresist pattern 117 before the formation of the first layer. For this difference in height, the second layer is also easily disconnected. This similarly applies to the case of forming third and subsequent layers of the conductive film 118.

Next, patterning is performed in such a manner that part of the second amorphous semiconductor film 110 and part of the first amorphous semiconductor film 109 which are not covered with the source electrode and the drain electrode 159 in the pixel portion and the source wiring 119 that extends to the terminal portion are removed by etching. At this patterning, the source electrode and the drain electrode 159 in the pixel portion and the source wiring 119 that extends to the terminal portion are used as masks. A portion of the first amorphous semiconductor film 109 where a channel is formed is thinned because its surface layer is etched (see FIG. 6B).

Next, a resist 120 is formed over the entire surface as shown in FIG. 6C. After that, a photolithography process is performed in such a manner that a rear surface of the substrate 100 (a surface not provided with the thin films) is irradiated with exposure light (rear-surface light exposure). At this time, the gate electrode in the pixel portion and the gate wiring 107 that extends to the terminal portion and the source electrode and the drain electrode 159 in the pixel portion and the source wiring 119 that extends to the terminal portion which have already been formed over the substrate 100 are utilized as a light-blocking portion. Arrows shown in FIG. 6C indicate exposure light which transmits through the substrate 100 to reach the resist 120. A photoresist pattern 121 is formed through light-exposure and development steps (see FIG. 7A).

Next, patterning is performed in such a manner that an unnecessary portion of the first amorphous semiconductor film 109 is removed by etching with the use of the photoresist pattern 121 (see FIG. 7B). The photoresist pattern 121 is then separated; thus, a state shown in FIG. 7C is obtained.

Then, an insulating film 122 is formed over the entire surface by a plasma CVD method, a sputtering method, or the like (see FIG. 8A). The insulating film 122 may be formed to have a single-layer or stacked-layer structure using a silicon nitride film, a silicon oxide film, a silicon oxynitride film, a silicon nitride oxide film, or the like and functions as a passivation film.

Next, a resist 123 is formed over the entire surface as shown in FIG. 8B. Then, a photolithography process is performed using a third photomask 126 which is formed in such a manner that a light-transmitting substrate 124 is provided with a transmitting portion and a light-blocking portion 125 formed of a metal film. Arrows shown in FIG. 8B indicate exposure light which transmits through the third photomask 126 to reach the resist 123. A photoresist pattern 127 is formed through light-exposure and development steps (see FIG. 9A).

Subsequently, openings 128 for achieving electrical connection with a transparent conductive film which is formed in a later step are formed using the photoresist pattern 127 (see FIG. 9B). The photoresist pattern 127 is then separated; thus, a state shown in FIG. 9C is obtained.

Figures 10A, 10B:
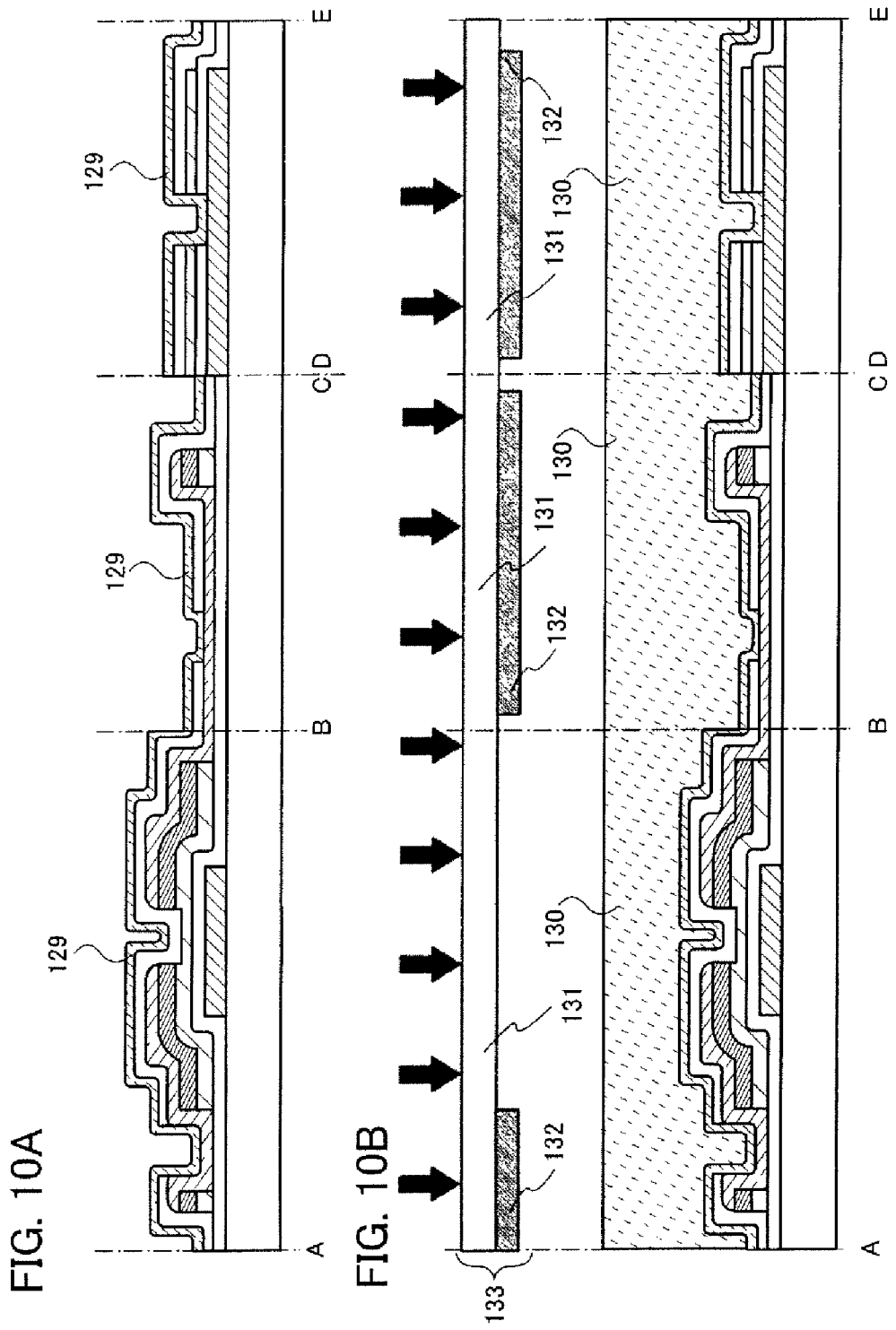
FIGS. 10A and 10B are cross-sectional views showing the process of manufacturing the semiconductor device in accordance with the present invention.

Next, a transparent conductive film 129 is formed over the entire surface by a sputtering method, a vacuum evaporation method, or the like (see FIG. 10A). The transparent conductive film 129 is formed of indium oxide ($In_2O_3$), an alloy of indium oxide and tin oxide ($In_2O_3$—$SnO_2$, hereinafter referred to as ITO), or the like. Since etching of ITO tends to leave residue, an alloy of indium oxide and zinc oxide ($In_2O_3$—ZnO) may be used in order to improve etching processability. $In_2O_3$—ZnO is superior in surface flatness and has excellent thermal stability as compared with ITO, and moreover corrosion reaction with an aluminum (Al) film can be prevented. In a similar manner, zinc oxide (ZnO) is also an appropriate material, and moreover zinc oxide to which gallium is added to increase conductivity and transmittance of visible light may be used.

Next, a resist 130 is formed over the entire surface as shown in FIG. 10B. Then, a photolithography process is performed using a fourth photomask 133 which is formed in such a manner that a light-transmitting substrate 131 is provided with a transmitting portion and a light-blocking portion 132 formed of a metal film. Arrows shown in FIG. 10B indicate exposure light which transmits through the fourth photomask 133 to reach the resist 130. A photoresist pattern 134 is formed through light-exposure and development steps (see FIG. 11A).

Subsequently, patterning is performed in such a manner that an unnecessary part of the transparent conductive film 129 is removed by etching with the use of the photoresist pattern 134 (see FIG. 111B). The photoresist pattern 134 is then separated; thus, a state shown in FIG. 11C is obtained. The transparent conductive film 129 functions as a pixel electrode in the pixel portion; in a terminal portion, the transparent conductive film 129 functions as an electrode for electrically connecting with a wiring of a circuit provided over another substrate.

In this manner, four photomasks are used in this embodiment mode to complete a pixel portion 135 having an inverted staggered TFT and terminal portions 136. When these TFTs are arranged in matrix corresponding to pixels, one substrate for manufacturing an active matrix electro-optical device (this substrate is hereinafter referred to as a TFT substrate) can be obtained.

Figure 12:
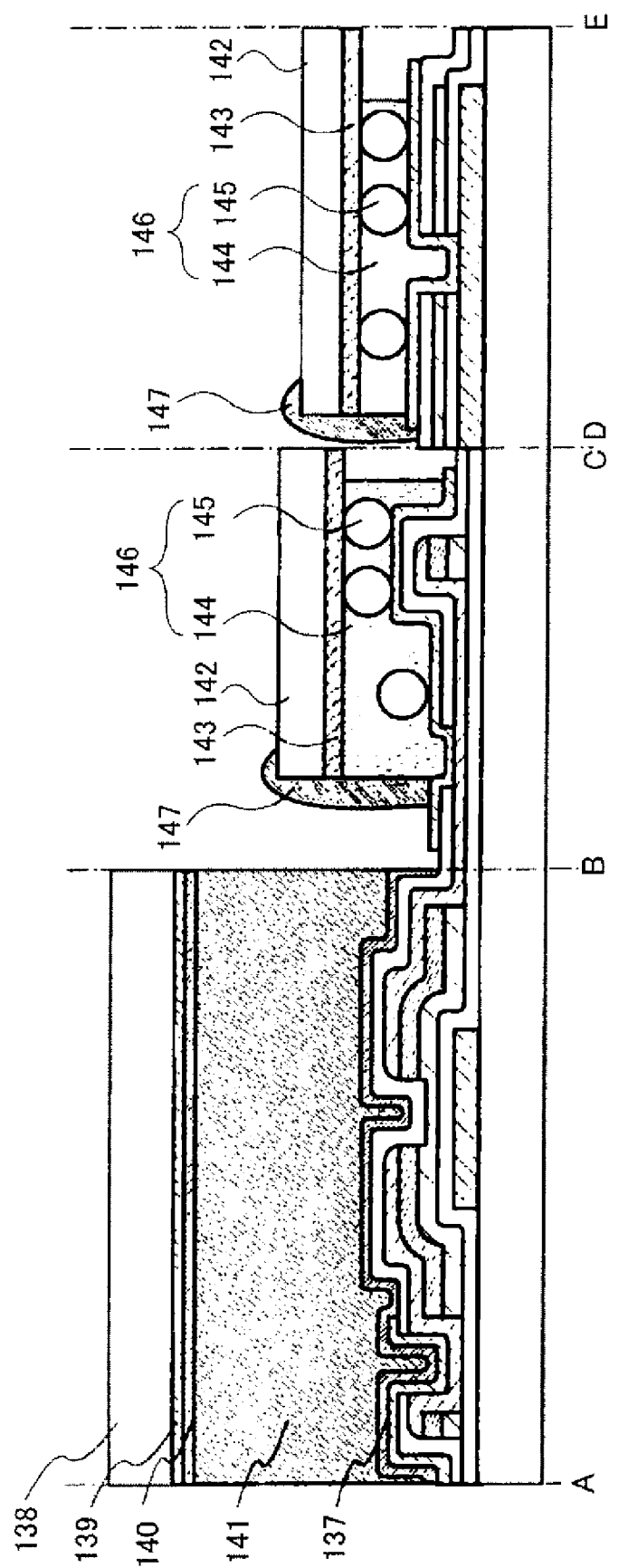
FIG. 12 is a cross-sectional view showing the process of manufacturing the semiconductor device in accordance with the present invention.

Next, an orientation film 137 is formed of a polyimide resin or the like selectively only in the pixel portion, as shown in FIG. 12. As a method for forming the orientation film 137 selectively, a screen printing method or a photolithography process for forming a photoresist pattern may be used. Then, the orientation film 137 is subjected to rubbing treatment so that liquid crystal molecules to be provided in a later step are oriented at a certain pretilt angle.

Next, the TFT substrate and a counter substrate 138 provided with a counter electrode 139 and an orientation film 140 are attached to each other with a sealant (not shown) using a spacer (not shown) to keep space between the substrates. Then, liquid crystals 141 are injected between the TFT substrate and the counter substrate and an inlet (not shown) is sealed with a resin material. The liquid crystals 141 may be provided by the aforementioned injection method or by a dropping method in which liquid crystals are dropped before attaching the TFT substrate and the counter substrate to each other.

Subsequently, a flexible printed circuit (FPC) is connected to the terminal portion. The FPC has a copper wiring 143 formed at an organic resin film 142 of polyimide or the like and is connected by an anisotropic conductive adhesive 146 to the transparent conductive film 129 which covers the terminal portion. The anisotropic conductive adhesive 146 includes an adhesive 144 and conductive particles 145. The conductive particle 145 is a particle plated with gold or the like to have a conductive surface, which has a diameter of several tens of micrometers to several hundreds of micrometers. When this conductive particle 145 is in contact with the transparent conductive film covering the terminal portion and the copper wiring 143, electrical connection therebetween is achieved. Moreover, a resin layer 147 is provided in order to increase the mechanical strength at this portion. Note that elements newly shown in FIG. 12 are not illustrated in FIG. 1.

Through these steps in which the number of photomasks is reduced as compared with that in conventionally performed steps, an electro-optical device typified by an active matrix liquid crystal display device can be completed.

Although a liquid crystal display device is described as one typical example of an electro-optical device in this embodiment mode, the present invention can also be applied to a self-light-emitting device such as an organic EL display device.

Embodiment Mode 2

Figure 13:
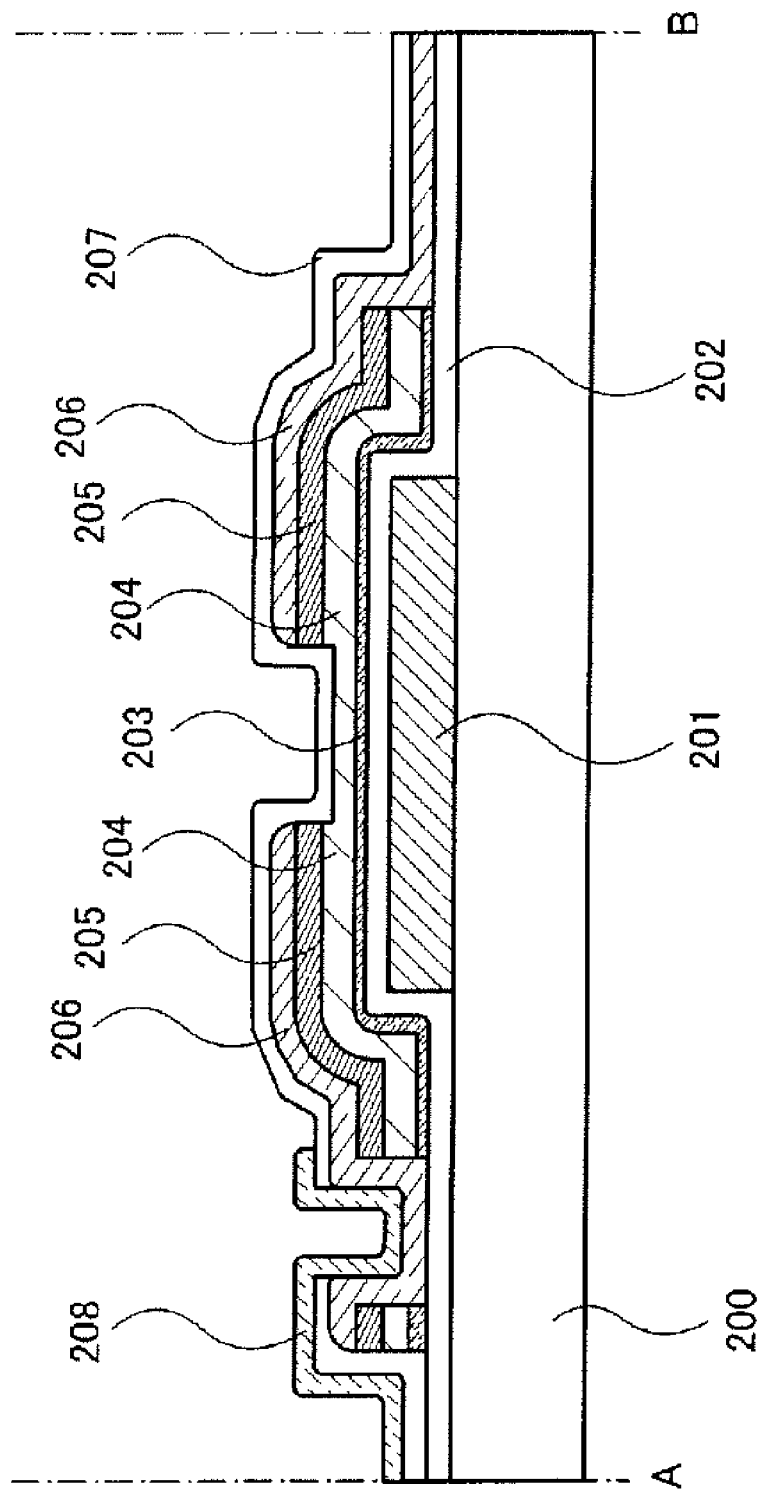
FIG. 13 is a cross-sectional view showing a process of manufacturing a semiconductor device in accordance with the present invention.

In this embodiment mode, an example in which a microcrystalline semiconductor film is used as a thin film which functions as a channel formation region of a TFT is described using FIG. 13. Note that FIG. 13 illustrates only a pixel portion which corresponds to a cross section along A-B of FIG. 1.

First, a gate electrode 201 in the pixel portion and a gate wiring that extends to a terminal portion are formed over a substrate 200 using a first photomask in accordance with Embodiment Mode 1. Next, an insulating film 202 is formed over the entire surface.

Then, a microcrystalline semiconductor film 203, a first amorphous semiconductor film 204, and a second amorphous semiconductor film 205 including an impurity element imparting one conductivity type are formed in order over the insulating film 202. It is preferable to form successively at least the insulating film 202, the microcrystalline semiconductor film 203, and the first amorphous semiconductor film 204. It is more preferable to form successively the insulating film 202, the microcrystalline semiconductor film 203, the first amorphous semiconductor film 204, and the second amorphous semiconductor film 205 including an impurity element imparting one conductivity type. When at least the insulating film 202, the microcrystalline semiconductor film 203, and the first amorphous semiconductor film 204 are formed successively without exposure to the air, the films can be stacked with their interfaces not contaminated by atmospheric components or impurity elements floating in the air. Thus, variation in TFT characteristics can be reduced.

The microcrystalline semiconductor film 203 is a film including a semiconductor having an intermediate structure between amorphous and crystalline structures (the crystalline structure includes single crystal and polycrystal). This microcrystalline semiconductor has a third state which is stable in terms of free energy, and is a crystalline substance having short-range order and lattice distortion. The microcrystalline semiconductor can have its grain size of 0.5 to 20 nm and can be dispersed in a non-single crystalline semiconductor. Microcrystalline silicon, which is a typical example of a microcrystalline semiconductor, has a Raman spectrum which is shifted to a lower wave number side than 520.6 cm$^{-1}$ which represents single crystal silicon. That is, the peak of a Raman spectrum of microcrystalline silicon is within the range from 520.6 cm$^{-1}$, which represents single crystal silicon, to 480 cm$^{-1}$, which represents amorphous silicon. The semiconductor includes at least 1 at. % of hydrogen or halogen to terminate a dangling bond. Moreover, when a rare gas element such as helium (He), argon (Ar), krypton (Kr), or neon (Ne) is contained to further promote its lattice distortion, the microcrystalline semiconductor film 203 can have higher stability. Description about such a microcrystalline semiconductor film is disclosed in, for example, U.S. Pat. No. 4,409,134.

The microcrystalline semiconductor film 203 can be formed by a high-frequency plasma CVD apparatus with a frequency of several tens to several hundreds of megahertz or a microwave plasma CVD apparatus with a frequency of 1 GHz or more. The microcrystalline semiconductor film 203 can be typically formed by dilution of silicon hydride or silicon halide, such as $SiH_4$, $Si_2H_6$, $SiH_2Cl_2$, $SiHCl_3$, $SiCl_4$, or $SiF_4$ with hydrogen or with hydrogen and one or more selected from helium (He), argon (Ar), krypton (Kr), or neon (Ne). The flow rate of hydrogen is greater than or equal to 5 times and less than or equal to 200 times, preferably greater than or equal to 50 time and less than or equal to 150 times, much more preferably 100 times as much as that of silicon hydride or silicon halide.

The microcrystalline semiconductor film 203 has low n-type conductivity when an impurity element for controlling valence electrons is not added thereto intentionally. Therefore, when an impurity element imparting p-type conductivity is added to the microcrystalline semiconductor film 203 which functions as a channel formation region of a TFT at the same time as the film formation or after the film formation, its threshold voltage can be controlled. A typical example of the impurity element imparting p-type conductivity is boron, and an impurity gas such as $B_2H_6$ or $BF_3$ may be mixed into silicon hydride or silicon halide at a proportion of 1 to 1000 ppm, preferably 1 to 100 ppm. Then, the concentration of boron (B) is preferably set in the range of, for example, $1\times10^{14}$ atoms/cm$^3$ to $6\times10^{16}$ atoms/cm$^3$.

The microcrystalline semiconductor film 203 preferably includes oxygen at a concentration of $5 \times 10^{19}$ atoms/cm$^3$ or less, more preferably $1 \times 10^{19}$ atoms/cm$^3$ or less. Further, the microcrystalline semiconductor film 203 preferably includes nitrogen and carbon each at a concentration of $5 \times 10^{18}$ atoms/cm$^3$ or less, more preferably $1 \times 10^{18}$ atoms/cm$^3$ or less. By the decrease in concentrations of oxygen, nitrogen, and carbon which is mixed into the microcrystalline semiconductor film 203, the microcrystalline semiconductor film 203 can be prevented from having n-type conductivity.

The microcrystalline semiconductor film 203 is formed to a thickness of greater than 0 nm and less than or equal to 50 nm, preferably greater than 0 nm and less than or equal to 20 nm. The microcrystalline semiconductor film 203 functions as a channel formation region of a TFT to be formed later. When the microcrystalline semiconductor film 203 is formed to a thickness within the above-described range, a TFT to be formed later is to be a fully depleted type. Furthermore, because the microcrystalline semiconductor film 203 includes microcrystals, it has a lower resistance than an amorphous semiconductor film. Therefore, a TFT using the microcrystalline semiconductor film 203 has current-voltage characteristics represented by a steeply rising curve, is superior in response as a switching element, and can operate at high speed. Moreover, with the use of the microcrystalline semiconductor film 203 for a channel formation region of a TFT, change in the threshold voltage of the TFT can be suppressed. Therefore, an electro-optical display device with less variation of electrical characteristics can be manufactured.

The microcrystalline semiconductor film 203 has higher mobility than an amorphous semiconductor film. Thus, when a TFT whose channel formation region is formed of the microcrystalline semiconductor film 203 is used for switching of a display element, the area of the channel formation region, that is, the area of the TFT can be decreased. Accordingly, the area of the TFT in a single pixel is reduced, and thus, the aperture ratio of the pixel can be increased. As a result, an electro-optical device with high resolution can be manufactured.

The first amorphous semiconductor film 204 can be formed by a plasma CVD method using a silicon hydride gas or a silicon halide gas, such as $SiH_4$, $Si_2H_6$, $SiH_2Cl_2$, $SiHCl_3$, $SiCl_4$, or $SiF_4$. Further, the first amorphous semiconductor film 204 can be formed by dilution of the aforementioned gas with one or plural kinds of rare gas elements selected from helium (He), argon (Ar), krypton (Kr), or neon (Ne). The first amorphous semiconductor film 204 can be formed to include hydrogen when the flow rate of hydrogen is greater than or equal to 1 time and less than 5 times as high as that of silicon hydride or silicon halide. Alternatively, the first amorphous semiconductor film 204 can be formed to include nitrogen when the aforementioned gas and nitrogen or ammonia are used. Further alternatively, the first amorphous semiconductor film 204 can be formed to include fluorine or chlorine when the aforementioned gas and fluorine or chlorine (such as $F_2$, $Cl_2$, HF, or HCl) are used.

The first amorphous semiconductor film 204 can be formed by sputtering with hydrogen or a rare gas using an amorphous semiconductor as a target. In this case, by inclusion of ammonia, nitrogen, or $N_2O$ in an atmosphere, the amorphous semiconductor film 204 can be formed to include nitrogen. Alternatively, by inclusion of a gas including fluorine or chlorine (such as $F_2$, $Cl_2$, HF, or HCl) in the atmosphere, the first amorphous semiconductor film 204 can be formed to include fluorine or chlorine.

Still alternatively, the amorphous semiconductor film 204 may be formed in such a manner that the first amorphous semiconductor film 204 is formed by a plasma CVD method or a sputtering method over a surface of the microcrystalline semiconductor film 203, and then a surface of the first amorphous semiconductor film 204 is subjected to hydrogen plasma, nitrogen plasma, or halogen plasma so that the surface of the first amorphous semiconductor film 204 is hydrogenated, nitrided, or halogenated.

This first amorphous semiconductor film 204 is preferably formed using an amorphous semiconductor film including no crystal grains. Therefore, in the case of employing a high-frequency plasma CVD method with a frequency of several tens of megahertz to several hundreds of megahertz or a microwave plasma CVD method, the film-formation condition is preferably controlled so that the amorphous semiconductor film is formed to include no crystal grains.

Since the amorphous semiconductor film 204 is partly etched in a later step, it is preferable to form the amorphous semiconductor film 204 with a thickness such that it remains partly even after the etching. Typically, the thickness is preferably greater than or equal to 10 nm and less than or equal to 100 nm.

By the formation of the first amorphous semiconductor film 204 on the surface of the microcrystalline semiconductor film 203, it is possible to prevent natural oxidation of surfaces of crystal grains in the microcrystalline semiconductor film 203. In particular, in a region where an amorphous semiconductor is in contact with microcrystal grains, a crack is likely to be caused due to crystal lattice distortion. If this crack is exposed to oxygen, the crystal grain is oxidized to form silicon oxide. However, by formation of the first amorphous semiconductor film 204 on the surface of the microcrystalline semiconductor film 203, the oxidation of microcrystal grains can be prevented.

Further, since the first amorphous semiconductor film 204 is formed using an amorphous semiconductor or an amorphous semiconductor including hydrogen, nitrogen, or halogen, the first amorphous semiconductor film 204 has higher resistance than the microcrystalline semiconductor film 203 serving as a channel formation region. Therefore, in a TFT to be formed later, the first amorphous semiconductor film 204 formed between the microcrystalline semiconductor film 203 and the second amorphous semiconductor film 205 including an impurity element imparting one conductivity type functions as a high-resistance region. Accordingly, the off current of the TFT can be reduced. When such a TFT is used as a switching element of an electro-optical device, a liquid crystal display device or the like can achieve higher contrast.

In a case of forming an n-channel TFT, the second amorphous semiconductor film 205 may include phosphorus (P) as a typical impurity element in such a manner that an impurity gas such as $PH_3$ may be added to silicon hydride or the like. The second amorphous semiconductor film 205 including an impurity element imparting one conductivity type may be formed to a thickness of 2 nm to 50 nm (preferably 10 nm to 30 nm).

Next, in accordance with Embodiment Mode 1, the microcrystalline semiconductor film 203, the first amorphous semiconductor film 204, and the second amorphous semiconductor film 205 including an impurity element imparting one conductivity type are etched using as a mask, a second photoresist pattern formed using a second photomask. After that, by a method similar to Embodiment Mode 1, a third photoresist pattern is formed by processing the second photoresist pattern without using a new photomask, a conductive film is formed over an entire surface including the third photoresist pattern, and the third photoresist pattern and the conductive film formed over the third photoresist pattern are removed at the same time. Accordingly, a source electrode and a drain electrode in the pixel portion and a source wiring 206 that extends to the terminal portion are formed without an etching step.

After that, a third photomask and a fourth photomask are used in accordance with Embodiment Mode 1. In this manner, an inverted staggered TFT using the microcrystalline semiconductor film 203 for a channel formation region can be completed using the four photomasks in total. Note that reference numerals 207 and 208 denote an insulating film and a transparent conductive film, respectively, in FIG. 13.

Embodiment Mode 3

Semiconductor devices and electronic appliances according to the present invention include cameras such as video cameras or digital cameras, goggle-type displays (head mount displays), navigation systems, sound reproducing systems (such as car audio systems, audio components), laptop personal computers, game machines, personal digital assistants (such as mobile computers, cellular phones, portable game consoles, or electronic books), and image reproduction devices provided with recording media (specifically, a device which can reproduce the content of a recording medium such as a Digital Versatile Disc (DVD) and which is provided with a display that shows the image). FIGS. 14A to 14D and FIG. 15 show specific examples of those electronic appliances.

Figure 14A:
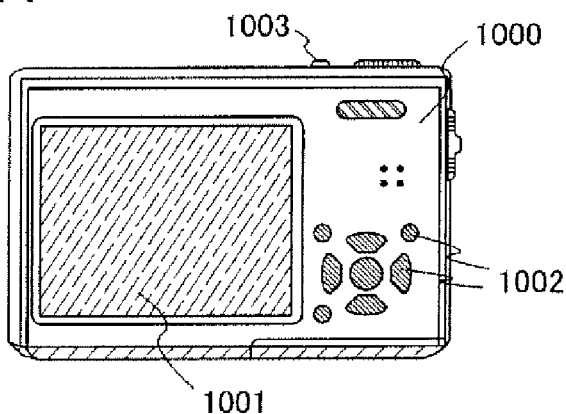
FIGS. 14A to 14D show examples of electronic appliances.

FIG. 14A illustrates a digital camera, which includes a main body 1000, a display portion 1001, an imaging portion, operation keys 1002, a shutter button 1003, and the like. FIG. 14A is a figure of the digital camera which is seen from the display portion 1001 side, and the imaging portion is not shown. In accordance with the present invention, a digital camera that has a less expensive display portion can be achieved.

Figure 14B:
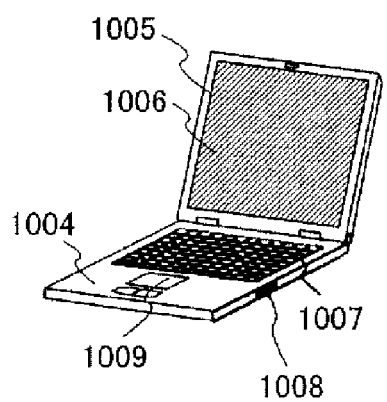

FIG. 14B illustrates a laptop personal computer including a main body 1004, a housing 1005, a display portion 1006, a keyboard 1007, an external connection port 1008, a pointing device 1009, and the like. In accordance with the present invention, a laptop personal computer that has a less expensive display portion can be achieved.

Figure 14C:
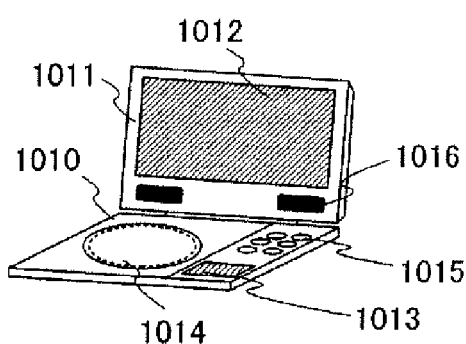

FIG. 14C illustrates an image reproducing device (specifically, a DVD reproducing device), which includes a main body 1010, a housing 1011, a first display portion 1012, a second display portion 1013, a recording medium (DVD or the like) reading portion 1014, operation keys 1015, speaker portions 1016, and the like. The first display portion 1012 mainly displays image data while the second display portion 1013 mainly displays text data. Examples of the image reproducing device provided with a recording medium further include a home-use game console and the like. In accordance with the present invention, an image reproducing device that has a less expensive display portion can be achieved.

Figure 14D:
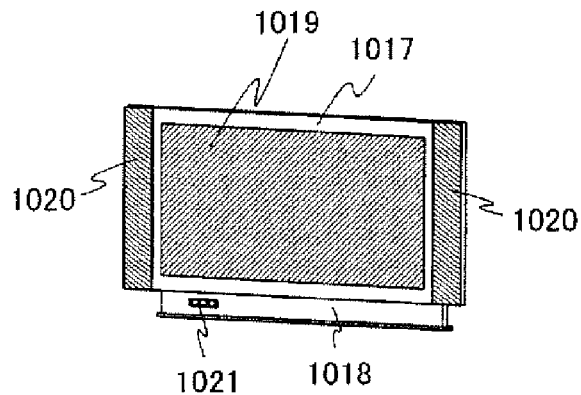

FIG. 14D illustrates a display device which includes a housing 1017, a supporting stand 1018, a display portion 1019, speakers 1020, a video input terminal 1021, and the like. This display device is manufactured using the TFT, which is formed by the manufacturing method shown in the above embodiment mode, in the display portion 1019 and a driver circuit. Note that the category of the display device includes liquid crystal display devices, light-emitting display devices, and the like; specifically, all types of display devices for displaying information, for example, display devices for thin television sets, personal computers, and advertisement are included. In accordance with the present invention, a display device having an inexpensive display portion, particularly a large-sized display device having a large screen of 22 to 50 inches can be achieved.

Figure 15:
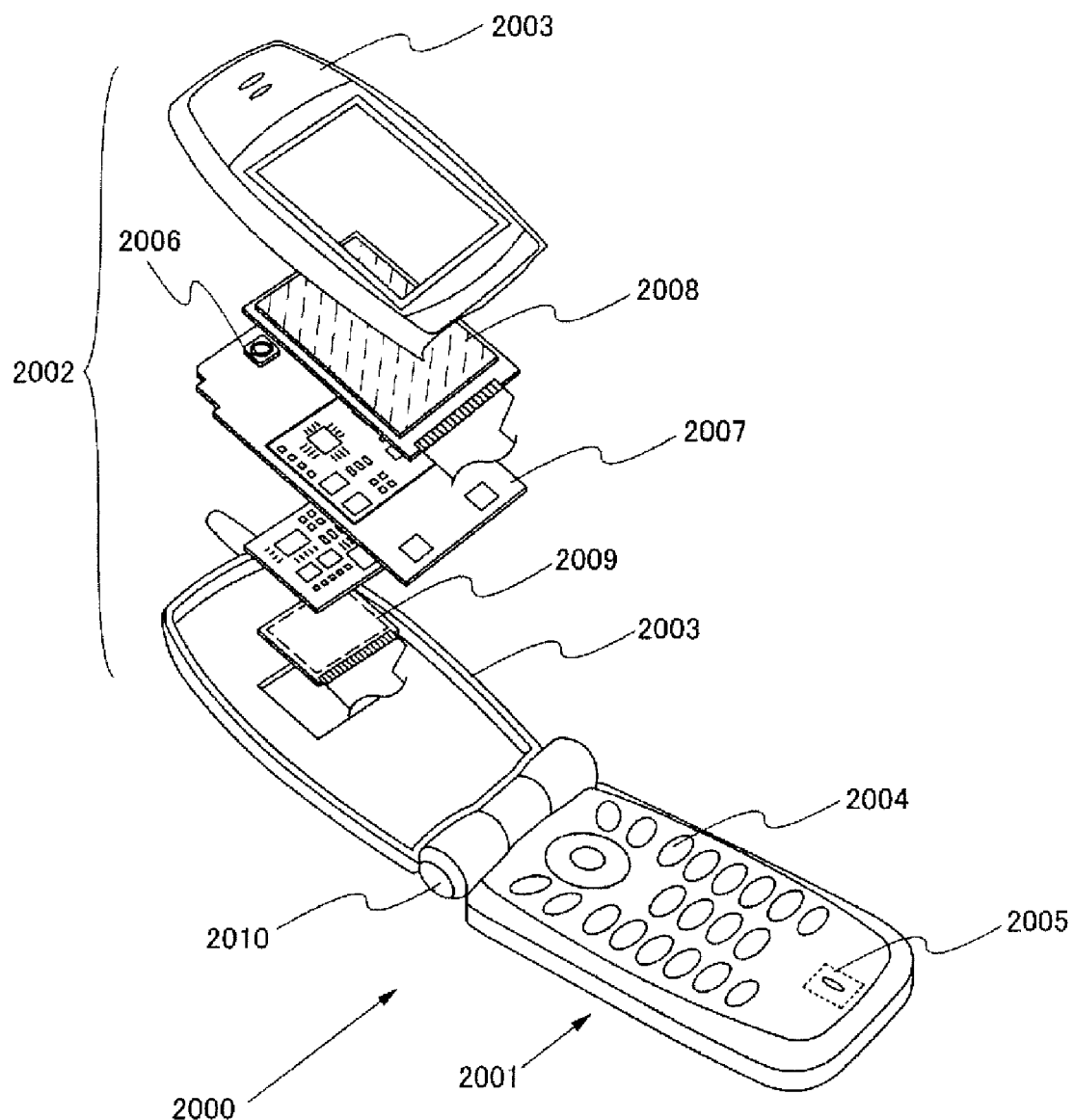
FIG. 15 shows an example of an electronic appliance.

In a cellular phone 2000 shown in FIG. 15, a main body (A) 2001 provided with operation switches 2004, a microphone 2005, and the like is connected with a hinge 2010 to a main body (B) 2002 provided with a display panel (A) 2008, a display panel (B) 2009, a speaker 2006, and the like, and it is capable of opening and folding by the hinge 2010. The display panel (A) 2008 and the display panel (B) 2009 are incorporated in a housing 2003 in the main body (B) 2002 along with a circuit board 2007. Pixel portions of the display panel (A) 2008 and the display panel (B) 2009 are arranged so as to be seen from an open window of the housing 2003.

The specifications of the display panel (A) 2008 and the display panel (B) 2009, such as the number of pixels, can be set as appropriate in accordance with the function of the cellular phone 2000. For example, the display panel (A) 2008 can be used as a main screen and the display panel (B) 2009 can be used as a sub-screen.

In accordance with the present invention, a cellular phone having an inexpensive display portion can be achieved.

The cellular phone 2000 according to the present embodiment mode can be changed into a variety of modes depending on the functions and applications thereof. For example, it may be a camera-equipped cellular phone by incorporating an imaging element in the hinge 2010. Even when the operation switches 2004, the display panel (A) 2008, and the display panel (B) 2009 are placed in one housing, the above-described effect can be obtained. Further, similar effects can be obtained even when the structure of this embodiment mode is applied to an information display terminal provided with a plurality of display portions.

As described above, by carrying out the present invention, that is, by using any one of the manufacturing methods in Embodiment Modes 1 and 2, a variety of electronic appliances can be completed.

In the present invention, a photomask (a multitone photomask) is used in manufacturing a terminal portion and a pixel portion having an inverted staggered TFT in the field of electro-optical devices typified by active matrix liquid crystal display devices. The photomask is formed in such a manner that a light-transmitting substrate is provided with a transmitting portion, a partially-transmitting portion having a function of reducing tight intensity, and a light-blocking portion. Moreover, a lift-off method is employed in patterning of a source electrode and a drain electrode in the pixel portion and a source wiring that extends to the terminal portion. Accordingly, the number of photomasks which used to be necessary (5 or more) can be reduced, and moreover an etching step for patterning of a source electrode and a drain electrode in the pixel portion and a source wiring that extends to the terminal portion can be omitted. Therefore, the productivity and yield of electro-optical devices can be improved and the manufacturing cost thereof can be reduced.

This application is based on Japanese Patent Application serial no. 2007-275804 filed with Japan Patent Office on Oct. 23, 2007, the entire contents of which are hereby incorporated by reference.

What is claimed is:

1. A method of manufacturing a semiconductor device, comprising:
   forming a gate electrode over a light-transmitting substrate;
   forming a gate insulating film over the gate electrode;
   forming a first semiconductor film over the gate insulating film;

forming a second semiconductor film including an impurity element imparting one conductivity type over the first semiconductor film;

forming a first photoresist pattern over the second semiconductor film with use of a multitone photomask;

etching the first semiconductor film and the second semiconductor film using the first photoresist pattern as a mask;

forming a second photoresist pattern by processing the first photoresist pattern;

forming a conductive film over the gate insulating film, the second semiconductor film, and the second photoresist pattern; and forming a source electrode and a drain electrode by removing the second photoresist pattern and a portion of the conductive film formed over the second photoresist pattern at the same time.

2. The method of manufacturing the semiconductor device according to claim 1, wherein the source electrode and the drain electrode have a stacked structure including a plurality of conductive films.

3. The method of manufacturing the semiconductor device according to claim 1, wherein the first semiconductor film and the second semiconductor film are amorphous semiconductor films.

4. The method of manufacturing the semiconductor device according to claim 1, wherein the first semiconductor film has a stacked structure including a microcrystalline semiconductor film and an amorphous semiconductor film.

5. The method of manufacturing the semiconductor device according to claim 1, wherein the processing is performing a plasma ashing.

6. The method of manufacturing the semiconductor device according to claim 1, wherein the multitone photomask is a halftone photomask or a graytone photomask.

7. A method of manufacturing a semiconductor device, comprising:

forming a gate electrode in a pixel portion and a gate wiring that extends to a terminal portion, both of which are formed of the same material over a light-transmitting substrate;

forming a gate insulating film over the gate electrode and the gate wiring;

forming a first semiconductor film over the gate insulating film;

forming a second semiconductor film including an impurity element imparting one conductivity type over the first semiconductor film;

forming a first photoresist pattern over the second semiconductor film with use of a multitone photomask;

etching the first semiconductor film and the second semiconductor film using the first photoresist pattern as a mask;

forming a second photoresist pattern by processing the first photoresist pattern;

forming a conductive film over the gate insulating film, the second semiconductor film, and the second photoresist pattern; and forming a source electrode and a drain electrode in the pixel portion and a source wiring that extends to the terminal portion by removing the second photoresist pattern and a portion of the conductive film formed over the second photoresist pattern at the same time.

8. The method of manufacturing the semiconductor device according to claim 7, wherein the source electrode, the drain electrode, and the source wiring have a stacked structure including a plurality of conductive films.

9. The method of manufacturing the semiconductor device according to claim 7, wherein the first semiconductor film and the second semiconductor film are amorphous semiconductor films.

10. The method of manufacturing the semiconductor device according to claim 7, wherein the first semiconductor film has a stacked structure including a microcrystalline semiconductor film and an amorphous semiconductor film.

11. The method of manufacturing the semiconductor device according to claim 7, wherein the processing is performing a plasma ashing.

12. The method of manufacturing the semiconductor device according to claim 7, wherein the multitone photomask is a halftone photomask or a graytone photomask.

13. A method of manufacturing a semiconductor device, comprising:

forming a first conductive film over a light-transmitting substrate;

forming a first photoresist pattern over the first conductive film with use of a first photomask;

forming a gate electrode in a pixel portion and a gate wiring that extends to a terminal portion by etching the first conductive film with use of the first photoresist pattern as a mask;

forming a gate insulating film over the substrate and the first conductive film;

forming a first semiconductor film over the gate insulating film;

forming a second semiconductor film including an impurity element imparting one conductivity type over the first semiconductor film;

forming a second photoresist pattern over the second semiconductor film with use of a second photomask, which is a multitone photomask;

etching the first semiconductor film and the second semiconductor film with use of the second photoresist pattern as a mask;

forming a third photoresist pattern by processing the second photoresist pattern;

forming a second conductive film over the gate insulating film, the second semiconductor film, and the third photoresist pattern;

forming a source electrode and a drain electrode in the pixel portion and a source wiring that extends to the terminal portion by removing the third photoresist pattern and a portion of the second conductive film formed over the third photoresist pattern at the same time;

etching the first semiconductor film and the second semiconductor film with use of the source electrode, the drain electrode and the source wiring as masks;

forming a fourth photoresist pattern by performing rear surface light exposure with the gate electrode, the gate wiring, the source electrode, the drain electrode and the source wiring used as photomasks;

etching the first semiconductor film with the fourth photoresist pattern used as a mask;

forming an insulating film over the gate insulating film, the first semiconductor film, and the second conductive film;

forming a fifth photoresist pattern over the insulating film with use of a third photomask;

forming an opening in the insulating film by etching the insulating film with the fifth photoresist pattern used as a mask;

forming a transparent conductive film over the first conductive film, the second conductive film, and the insulating film;

forming a sixth photoresist pattern over the transparent conductive film with use of a fourth photomask; and etching the transparent conductive film with the sixth photoresist pattern used as a mask.

14. The method of manufacturing a semiconductor device according to claim 13, wherein the source electrode, the drain electrode, and the source wiring have a stacked structure including a plurality of conductive films.

15. The method of manufacturing a semiconductor device according to claim 13, wherein the first semiconductor film and the second semiconductor film are amorphous semiconductor films.

16. The method of manufacturing a semiconductor device according to claim 13, wherein the first semiconductor film has a stacked structure including a microcrystalline semiconductor film and an amorphous semiconductor film.

17. The method of manufacturing a semiconductor device according to claim 13, wherein the processing is performing a plasma ashing.

18. The method of manufacturing a semiconductor device according to claim 13, wherein the multitone photomask is a halftone photomask or a graytone photomask.

* * * * *